(12) United States Patent
Huang et al.

(10) Patent No.: US 9,341,948 B2
(45) Date of Patent: May 17, 2016

(54) PHOTOPATTERNABLE MATERIALS AND RELATED ELECTRONIC DEVICES AND METHODS

(71) Applicant: Polyera Corporation, Skokie, IL (US)

(72) Inventors: Chun Huang, Arlington Heights, IL (US); Zhikai Wang, Roswell, GA (US); Yu Xia, Northbrook, IL (US); Meko McCray, Chicago, IL (US); Theresa L. Starck, Chicago, IL (US); Darwin Scott Bull, Mundelein, IL (US); Antonio Facchetti, Chicago, IL (US); Xiang Yu, Skokie, IL (US)

(73) Assignee: Polyera Corporation, Skokie, IL (US)

( * ) Notice: Subject to any disclaimer, the term of this patent is extended or adjusted under 35 U.S.C. 154(b) by 0 days.

(21) Appl. No.: 14/468,319

(22) Filed: Aug. 25, 2014

(65) Prior Publication Data

US 2015/0056553 A1    Feb. 26, 2015

Related U.S. Application Data

(60) Provisional application No. 61/869,668, filed on Aug. 24, 2013.

(51) Int. Cl.
*G03F 7/075* (2006.01)
*G03F 7/038* (2006.01)

(52) U.S. Cl.
CPC ............ *G03F 7/0755* (2013.01); *G03F 7/0384* (2013.01); *G03F 7/0757* (2013.01); *G03F 7/0758* (2013.01)

(58) Field of Classification Search
None
See application file for complete search history.

(56) References Cited

U.S. PATENT DOCUMENTS

| 2006/0009578 A1* | 1/2006 | Dershem ..................... 524/863 |
| 2010/0316889 A1* | 12/2010 | Arai et al. ............ C08G 77/045 264/496 |
| 2011/0245363 A1* | 10/2011 | Choi et al. .............. G03F 7/027 522/64 |
| 2014/0018475 A1* | 1/2014 | Falkner et al. ..... C08G 59/1438 523/458 |

FOREIGN PATENT DOCUMENTS

| JP | 2010106205 A | * | 5/2010 |
| WO | WO-2013/138730 A1 | * | 9/2013 |

OTHER PUBLICATIONS

Gotro, J. and Prime, R. B. 2004. Thermosets. Encyclopedia of Polymer Science and Technology.pp. 207-260.*

* cited by examiner

*Primary Examiner* — Cynthia Hamilton
(74) *Attorney, Agent, or Firm* — Karen K. Chan

(57) ABSTRACT

Described herein is a solution-processable composition for preparing a photopatternable material. The solution-processable composition generally includes (a) an oligomeric siloxane component that includes, based on its total weight, between about 40% by weight and about 100% by weight one or more cage-structured polyhedral oligomeric silsesquioxanes that are functionalized with one or more crosslinkable moieties such as cycloaliphatic epoxy moieties, (b) a polymerization initiator; (c) one or more thermosettable polymers that collectively are present in an amount between about 1% by weight and about 20% by weight based on the total weight of the oligomeric siloxane component; and (d) a solvent.

20 Claims, 9 Drawing Sheets

PHOTOPATTERNABLE MATERIALS AND RELATED ELECTRONIC DEVICES AND METHODS

CROSS-REFERENCE TO RELATED APPLICATIONS

This application claims priority to and the benefit of U.S. Provisional Patent Application Ser. No. 61/869,668, filed on Aug. 24, 2013, the disclosure of which is incorporated by reference herein in its entirety.

BACKGROUND

There has been a growing interest in developing electronic devices using metal oxides as the semiconductor component. These devices can offer advantages such as structural flexibility (e.g., foldable or bendable), potentially much lower manufacturing costs, and the possibility of low-temperature ambient manufacturing processes on large areas. Particularly, metal oxide semiconductors such as indium gallium zinc oxide (IGZO) can exhibit high charge carrier mobility and be processed at temperatures far lower than those required for silicon. Thus, metal oxide semiconductors can be used to enable new devices such as electronic paper, rigid or flexible organic light-emitting diode (OLED) displays, ultra-high resolution displays, radio-frequency identification (RFID) technologies, and transparent displays and circuits.

One of the key benefits to using metal oxides is the potential to use both vapor-phase and solution-phase deposition techniques to deposit the semiconductor as well as other materials needed to fabricate these devices. Yet, to further realize the processing advantages of metal oxide semiconductors, all active components of the device should be mechanically flexible and, preferably, most of the components of the device should be compatible with, if not processable by, solution-phase deposition fabrication.

For example, thin-film transistors (TFTs) based upon various solution-processed or vapor-deposited metal oxide semiconductors have been developed. However, the layers in the proximity of the oxide semiconductor channel layers also are critical components in TFTs. Depending on the TFT device architecture (see FIG. 1), such critical components can include the gate dielectric layer and the etch-stop (ES) layer and/or the passivation layer.

With respect to passivation materials, a few polymeric materials have been envisioned to be used as both the ES layer and the passivation layer. However, it has remained a challenge to identify materials that show excellent thermal stability, photopatternability, and good adhesion to both inorganic (e.g., metals, metal alloys, and metal oxides) and organic materials, while also acting as a moisture barrier, planarizing the surface, and conferring chemical protection to the oxide channel layer. Particularly, conventional photoresists, while providing excellent photopatternability, fail to enable the other requirements.

Accordingly, there is a desire in the art to provide new materials that are compatible with diverse substrates, conductor, and/or semiconductor materials such that they could be employed in the whole metal oxide TFT fabrication process to meet one or more device requirements including photopatternability, low current leakage densities, high thermal stability, resistance to harsh chemicals used in patterning steps, tuned surface energies, good adhesion, good solution-processability, and/or low permeation to water.

SUMMARY

In light of the foregoing, the present teachings provide photopatternable materials that can possess one or more desirable properties and characteristics which make them suitable as active (e.g., dielectric) and/or passive (e.g., passivation or etch-stop) materials in an electronic device such as a thin film field-effect transistor, particularly, a metal-oxide thin-film transistor.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
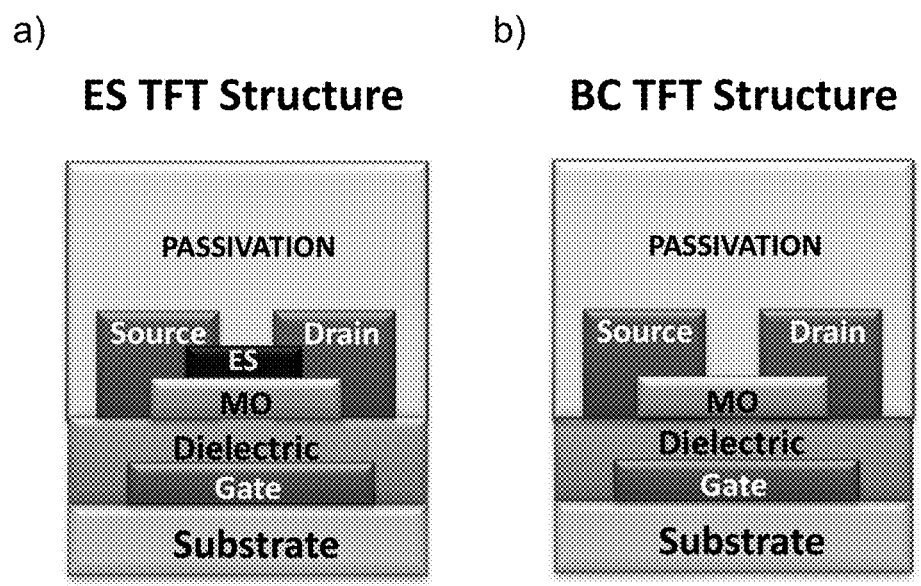
FIG. 1 illustrates the structure of (a) an etch-stop (ES) thin film transistor and (b) a back-channel-etch (BCE or BC) thin film transistor. In the illustrated architectures, both types of devices have a bottom-gate top-contact configuration, i.e., the source and drain electrodes are defined on top of the metal oxide (MO) semiconductor layer.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "crosslinkable" group refers to a functional group which is capable of reacting irreversibly. The crosslinking reaction can be effected by thermal, chemical, or radiative means. For example, a compound having a crosslinkable group can be crosslinked by heat (in the case of a compound having a thermally crosslinkable group) or by UV (in the case of a compound having a photo-crosslinkable group), microwave, X-ray or electron radiation. In some embodiments, a compound (e.g., a polymer) can be capable of self-crosslinking, that is, no auxiliary reagents are required. In some embodiments, a compound can form crosslinks upon reaction with another reagent (e.g., a photoacid generator or a free radical initiator). In some embodiments, a compound can be crosslinked via more than one mechanism.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

Throughout the specification, structures may or may not be presented with chemical names. Where any question arises as to nomenclature, the structure prevails.

In one aspect, the present teachings relate to metal oxide thin film transistors and their fabrication methods. The present transistors generally include a substrate, a gate electrode, a gate dielectric layer, a metal oxide semiconductor as the active channel layer, source and drain electrodes, and a passivation layer. More specifically, the passivation layer is composed of a photopatternable material described herein. As known in the art, the gate electrode, and the source and drain electrodes can be arranged in different configurations relative to the gate dielectric layer and the active channel layer to provide, for example, a top-gate top-contact structure, a top-gate bottom-contact structure, a bottom-gate top-contact structure, or a bottom-gate bottom-contact structure.

The metal oxide semiconductor active channel layer can be prepared from an oxide of indium, gallium, zinc, tin, or combinations thereof. For example, indium-gallium-zinc oxide (IGZO) offers various advantages including high field-effect mobility and optical transparency. However, IGZO thin film transistors (IGZO TFTs), like other metal oxide-based TFTs, also suffer from unreliable device operation due to its sensitivity to the environment. Specifically, adsorption/desorption of small molecular species present in ambient air onto the exposed back channel layer as well as light sensitivity (subgap photoresponse) can change the carrier concentration in the IGZO films. This results in a shift of the TFT threshold voltage ($V_{th}$), which over time leads to a nonuniformity problem. Identifying and/or designing a passivation material that can alleviate some of the known problems in IGZO TFTs while maintaining their advantages such as high mobility has proven difficult.

Polyhedral oligomeric silsesquioxanes are cage-structured silsesquioxanes having the basic composition of $(RSiO_{1.5})_n$, where the R groups are attached to the silicon atoms at the vertices of the cage. The most common polyhedral oligomeric silsesquioxanes have a $T_8$, $T_{10}$, or $T_{12}$ structure (n=8, 10, or 12, respectively) as shown below:

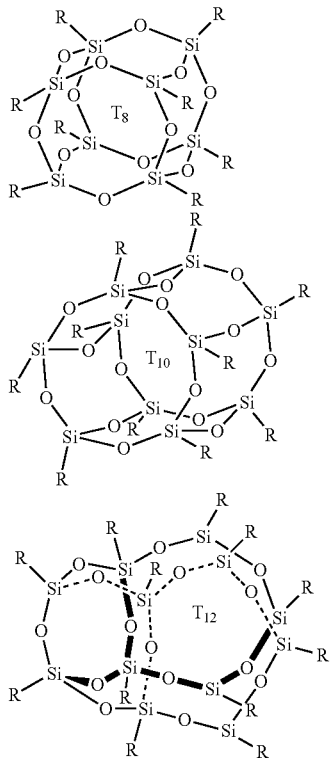

Polyhedral oligomeric silsesquioxanes have been functionalized with a wide variety of reactive R groups. For example, polyhedral oligomeric silsesquioxanes having crosslinkable R groups such as epoxy groups, vinyl/allyl groups, (meth) acrylate groups, and the like, have been investigated as low-k dielectric materials and molecular photoresists. Often, a photoinitiator is added to improve their photolithographic properties.

On the other hand, polyhedral oligomeric silsesquioxanes have been incorporated into polymeric matrix composites via copolymerization, grafting, and blending. The organic R groups of the polyhedral oligomeric silsesquioxanes can react with functional groups on the polymers to crosslink the polymeric matrix, while the inorganic core of the polyhedral oligomeric silsesquioxanes can perform functions typically afforded by inorganic fillers.

However, the dielectric, resist, and composite materials described above are unsuitable as passivation materials for metal oxide transistors due to their inability to alleviate gate bias stress effects that lead to instability of the transistor performance. The gate bias stress effects can be understood as follows. In a field-effect transistor, there are typically three electrodes, serving as gate source, and drain. The gate electrode supplies the controlling voltage to the transistor, and the semiconductor channel of the transistor conducts current from the source to the drain in response to the gate voltage. The gate dielectric of a transistor electrically insulates the gate from the semiconductor channel. Superior performance in a transistor requires a high channel conductance, fast "on" and "off" responses to the applied gate voltage, a very rapid increase and decrease in the source-to-drain current as the gate voltage rises and falls past a threshold switching value, minimal current leakage from the source to the drain in the absence of an applied gate voltage and negligible current leakage from the channel to the gate. These operating characteristics should be stable, and should not change or drift after a long period of applied gate voltage. In reality, switching a transistor on for some time often leads to a reduction in current at a given gate voltage (mobility reduction), current-voltage hysteresis, and/or a variation of the turn-on characteristics (threshold voltage, $V_{th}$, shift). Therefore, gate bias stress usually is studied by applying a fixed gate voltage for an extended time, followed by a measurement of the transfer curve characteristics.

Thin film transistors based on metal oxide semiconductors are known to be susceptible to bias instability. While the exact causes of gate bias stress effects are not completely understood, a contributing factor is believed to be the trapping and release of charge carriers on a time scale comparable to the measurement time. Another attributing factor to the $V_{th}$ instability is believed to be the interaction between the exposed metal oxide semiconductor back surface and oxygen and/or water in the ambient atmosphere during the gate voltage stress.

Unexpectedly, the inventors have developed a solution-processable photocurable material which was found to confer markedly improved bias stability when incorporated as the passivation layer in a metal oxide transistor. Specifically, the present teachings relate to a composition that comprises (a) a functionalized oligomeric siloxane component which includes, based on its total weight, between about 40% by weight and about 100% by weight one or more cage-structured polyhedral oligomeric silsesquioxanes of the formula $R^1{}_m R^2{}_n (SiO_{1.5})_q$, where each $R^1$ independently is an organic group comprising at least one crosslinkable moiety; each $R^2$ independently is a non-crosslinkable organic group; q is 8, 10 or 12; and m and n are integers, provided that m+n=q and m is at least 1; (b) a polymerization initiator; (c) one or more thermosettable polymers, where the one or more thermosettable polymers collectively are present in an amount between about 1% by weight and about 20% by weight based on the total weight of the functionalized oligomeric siloxane component; and (d) a solvent.

In preferred embodiments, the functionalized oligomeric siloxane component of the composition comprises a high weight percentage of polyhedral oligomeric silsesquioxanes ("POSS"). For example, the functionalized oligomeric siloxane component can include, based on its total weight, at least about 50% by weight of POSS. One or more non-cage structured functionalized oligomeric siloxanes can be present in the functionalized oligomeric siloxane component, but collectively, they are present in an amount less than about 40% by weight of the total weight of the functionalized oligomeric siloxane component. These non-cage structured functionalized oligomeric siloxanes can include random-structured functionalized oligomeric siloxanes, ladder-structured functionalized oligomeric siloxanes, partially cage-structured functionalized oligomeric siloxanes, or combinations thereof. The non-cage structured functionalized oligomeric siloxanes can be compositionally similar to the polyhedral oligomeric silsesquioxanes (identical $R^1$ and $R^2$ groups) but structure-wise are different from the polyhedral oligomeric silsesquioxanes by not being completely condensed and having free hydroxy groups.

The polyhedral oligomeric silsesquioxanes and, if present, the non-cage structured functionalized oligomeric siloxanes are functionalized with at least one organic group that includes a crosslinkable moiety ($R^1$ group). For example, the functionalized oligomeric siloxane component can include a high weight percentage of $T_8$ POSS represented by the formula: (i) $R^1R^2{}_7(SiO_{1.5})_8$, (ii) $R^1{}_2R^2{}_6(SiO_{1.5})_8$, (iii) $R^1{}_3R^2{}_5(SiO_{1.5})_8$, (iv) $R^1{}_4R^2{}_4(SiO_{1.5})_8$, (v) $R^1{}_5R^2{}_3(SiO_{1.5})_8$, (vi) $R^1{}_6R^2{}_2(SiO_{1.5})_8$, (vii) $R^1{}_7R^2(SiO_{1.5})_8$, or (viii) $(R^1SiO_{1.5})_8$; where each $R^1$ group independently can include a crosslinkable moiety as defined herein. For example, the crosslinkable moiety can be selected from a vinyl moiety, a vinyl ether moiety, a thiol moiety, a hydroxyl moiety (e.g., a phenolic moiety), a carboxylic acid moiety (e.g., a carboxyalkyl moiety, a carboxyaryl moiety), a methacrylate moiety, an acrylate moiety, and an epoxy moiety (e.g., a glycidyl ether moiety, a cycloaliphatic epoxy moiety); and each $R^2$ group independently can be selected from H, F, a $C_{1-20}$ alkyl group, a $C_{1-20}$ fluoroalkyl group, a $C_{3-20}$ cycloalkyl group, a $C_{6-20}$ aryl group, and a $C_{7-20}$ arylakyl group.

In certain embodiments, each $R^1$ group independently can be selected from -L-CH=CH$_2$, -L-O—CH=CH$_2$, -L-SH, -L-OH, -L-Ph-OH, -L-C(O)OH, -L-Ph-C(O)OH, -L-OC(O)C(CH$_3$)=CH$_2$, -L-OC(O)CH=CH$_2$, -L-OCH$_2$CH(O)CH$_2$, -L-epoxycyclopentyl, and -L-epoxycyclohexyl, where L can be a covalent bond or a divalent linker (e.g., a divalent $C_{1-20}$ alkyl linker, where one or more CH$_2$ moieties can be replaced by O, S, Si(CH$_3$)$_2$, S(O)$_2$, C(O)O, and the like); while each $R^2$ independently can be selected from an ethyl group, an isobutyl group, an isooctyl group, a cyclohexyl group, a trifluoropropyl group, and a phenyl group.

In particular embodiments, the functionalized oligomeric siloxane component can include one or more of the following cage-structured polyhedral oligomeric silsesquioxanes:

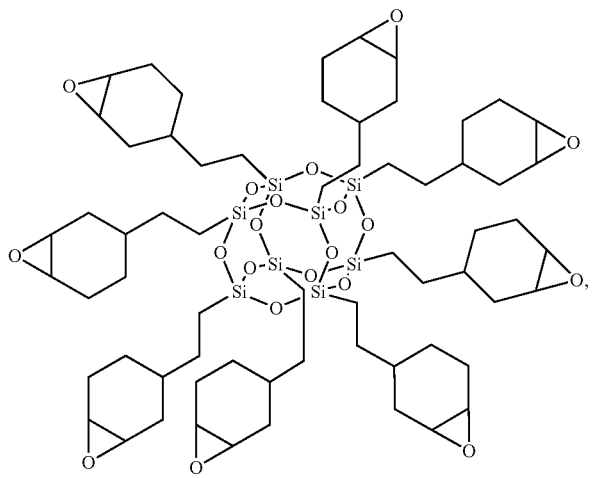

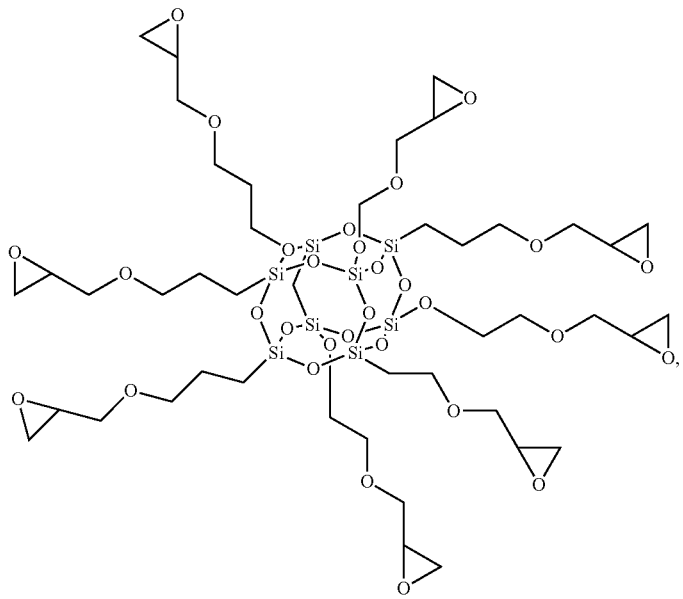

-continued
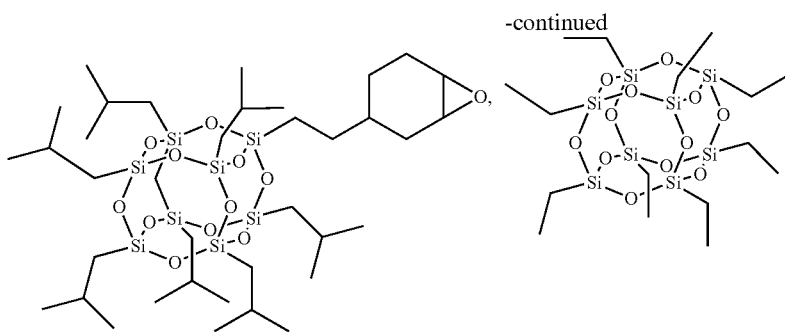
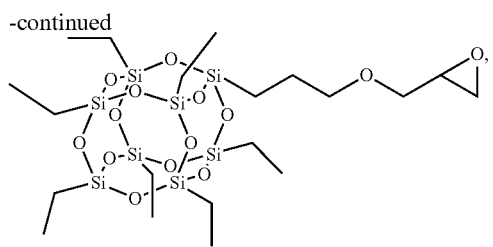
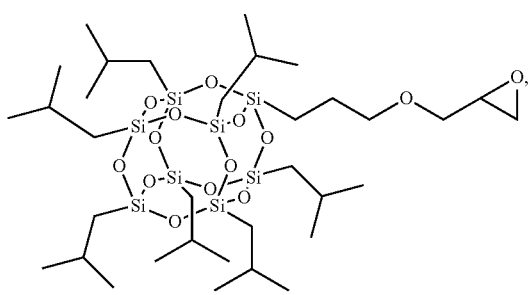
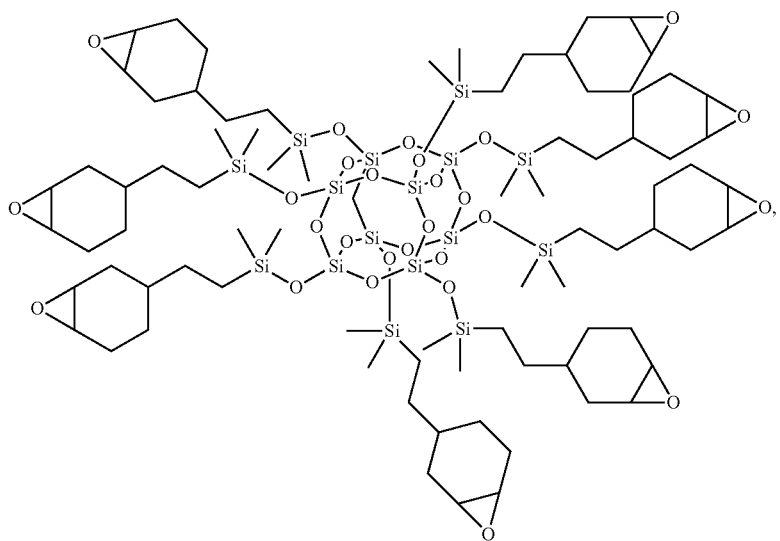
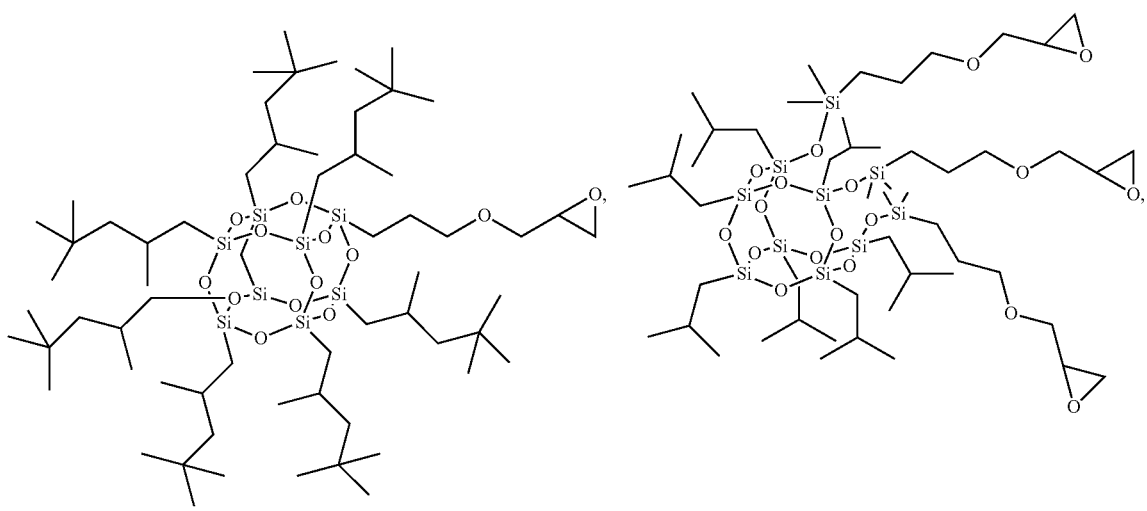

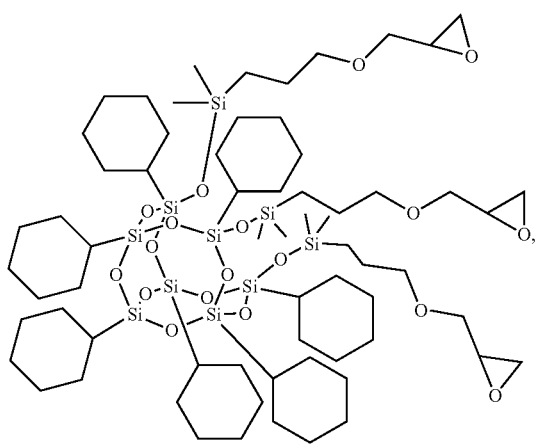
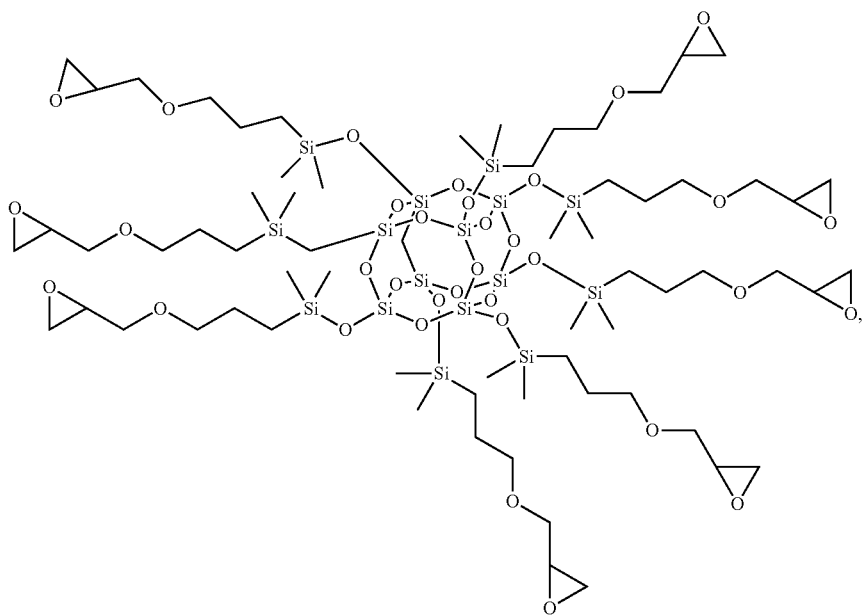
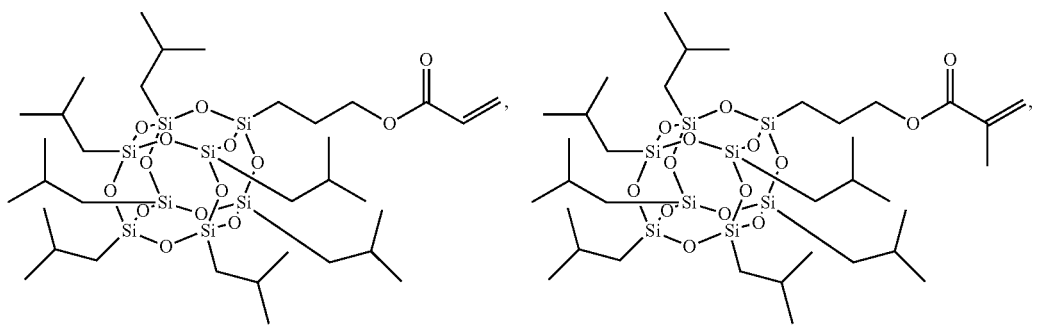

-continued
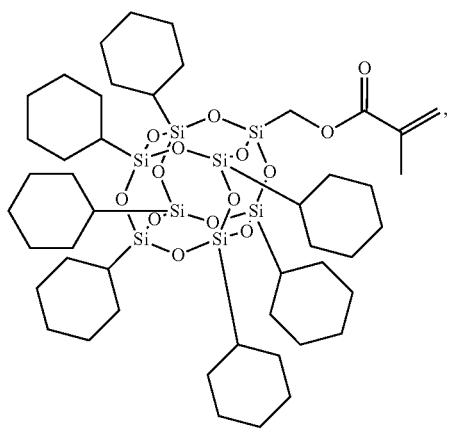
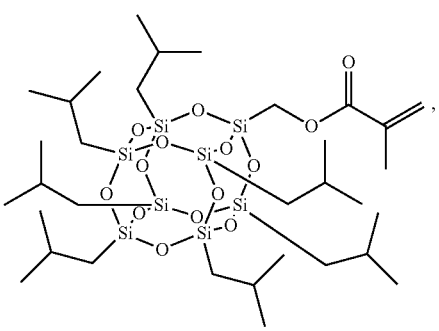
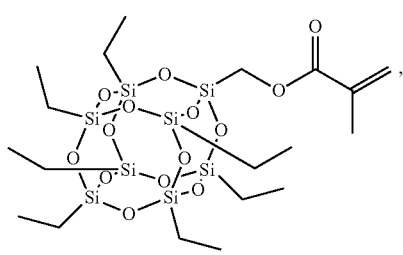
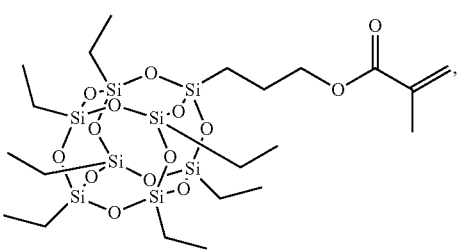
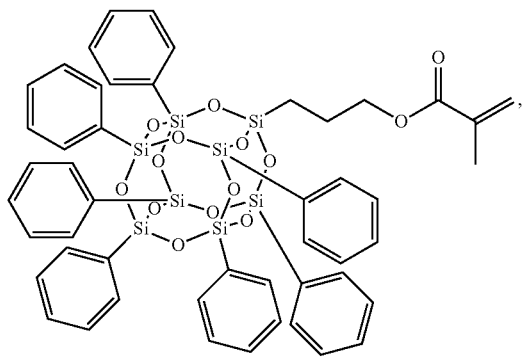
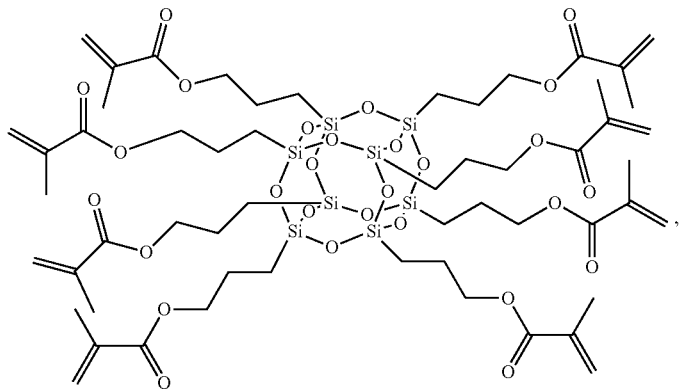

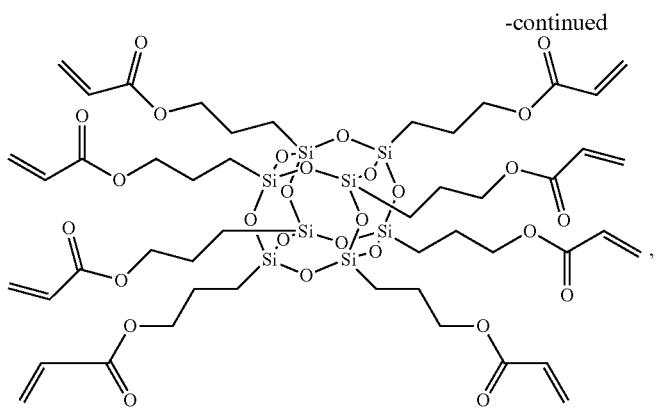

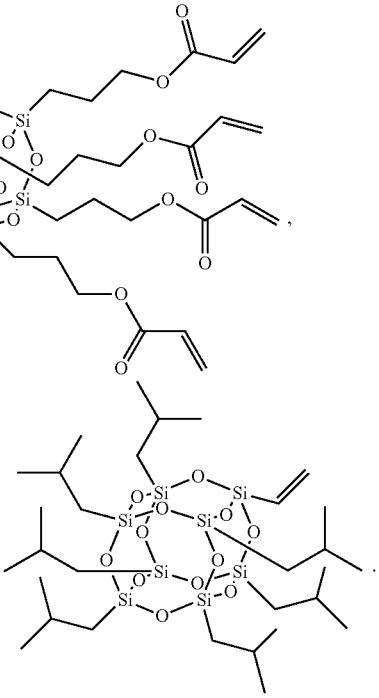

More generally, the functionalized oligomeric siloxane component can include one or more cage-structured polyhedral oligomeric silsesquioxanes represented by:

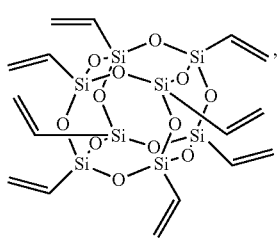

where $R^1$, $R^2$, $R^3$, $R^4$, $R^5$, $R^6$, $R^7$, and $R^8$, independently can be identical or different, and each can comprise an organic group comprising a moiety selected from alkyl, alkoxy, cycloalkyl, aryl, epoxy, thio-epoxy, cycloaliphatic-thio-epoxy, cycloaliphatic epoxy, vinyl, vinyl ether, acrylate, methacrylate, maleimide, cinnamate, dienoic cinnamate, coumarinyl, phenolic, and carboxylic acid, provided that at least one of $R^1$, $R^2$, $R^3$, $R^4$, $R^5$, $R^6$, $R^7$, and $R^8$ is an organic group comprising a moiety selected from epoxy, thio-epoxy, cycloaliphatic-thio-epoxy, cycloaliphatic epoxy, vinyl, vinyl ether, acrylate, methacrylate, maleimide, cinnamate, dienoic cinnamate, coumarinyl, phenolic, and carboxylic acid. For example, $R^1$, $R^2$, $R^3$, $R^4$, $R^5$, $R^6$, $R^7$, and $R^8$ independently can be selected from one or more of the following:

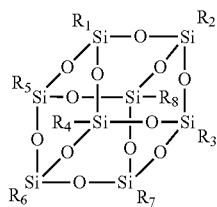

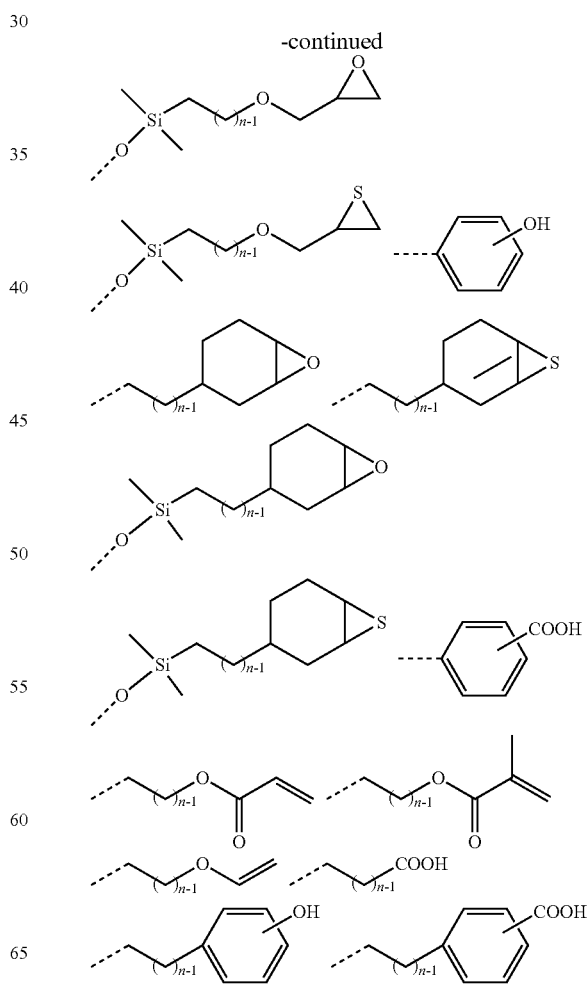

-continued

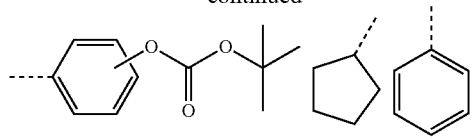

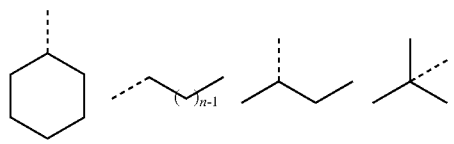

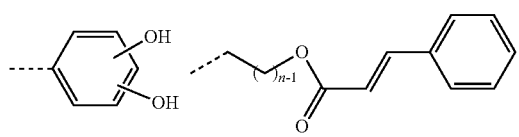

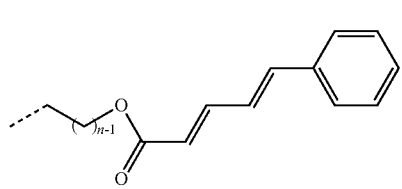

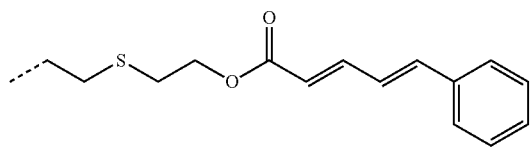

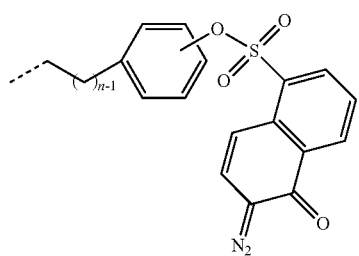

-continued

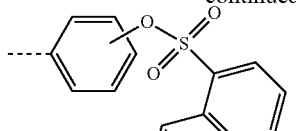

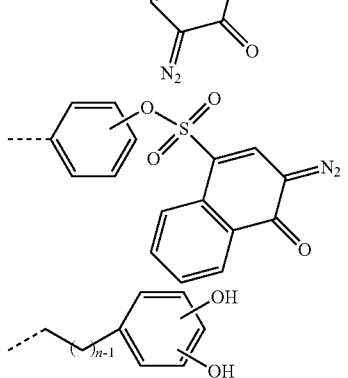

where n is 1-20. Further, any $CH_2$ group in the —$(CH_2)_{n-1}$— moiety can be replaced by O, S, C(O), C(O)O, or $OSi(CH_3)_2$, as illustrated by some of the embodiments. In certain embodiments, $R^1$, $R^2$, $R^3$, $R^4$, $R^5$, $R^6$, $R^7$, and $R^8$ can be organic groups soluble in aqueous solutions of tetramethylammonium hydroxide (TMAH).

In preferred embodiments, the functionalized oligomeric siloxane component can include cage-structured polyhedral oligomeric silsesquioxanes (and optionally non-cage structured functionalized oligomeric siloxanes) functionalized with one or more epoxy groups. For example, the epoxy group can be an epoxycyclohexyl ethyl group, a glycidyl group, or a propyl glycidyl ether group. The epoxy group can undergo photoinitiated ring-opening homopolymerization in the presence of a polymerization initiator that is a photoinitiator, particularly, a cationic photoinitator (or photoacid generator). Standard photoacid generators (PAGs) include various diaryliodonium, triaryliodonium and triarylsulfonium salts, triflic acid generators, nonaflic acid generators, and sulfonate (non-fluorinated) acid generators. Some commercially available PAGs are:

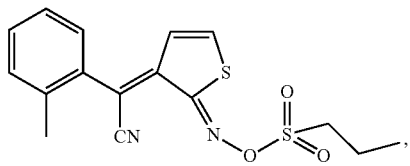

Irgacure PAG 103

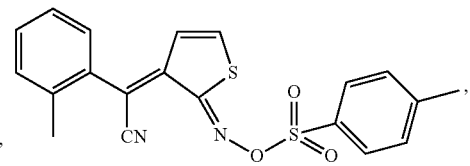

Irgacure PAG 121

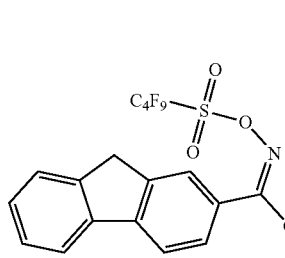

CGI 1907

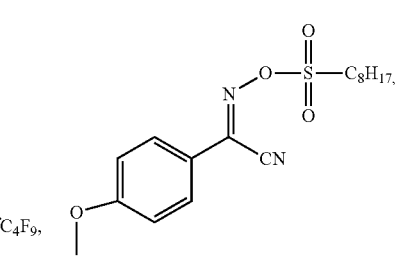

CGI 725

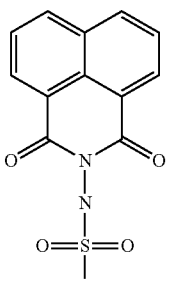

NIT

-continued

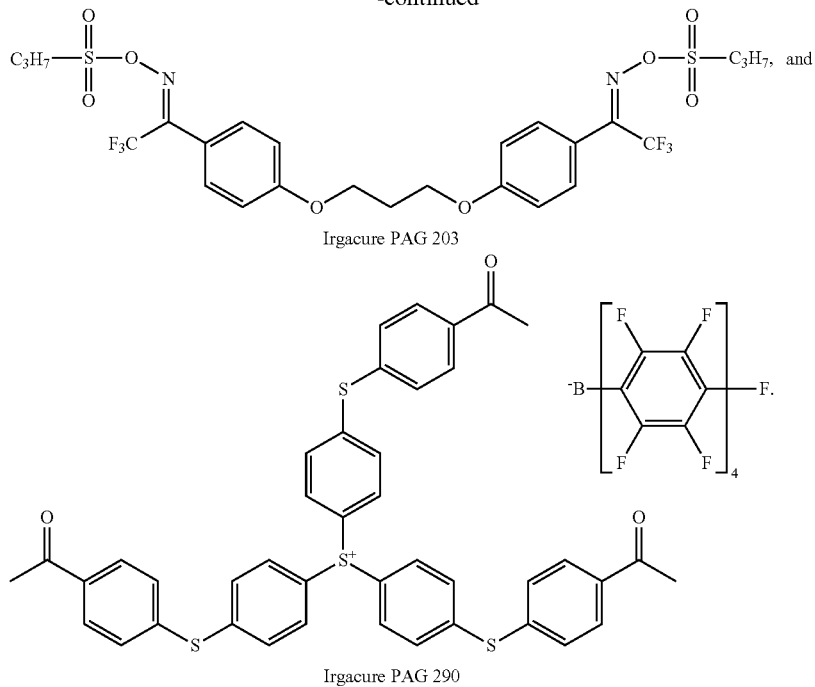

Irgacure PAG 203

Irgacure PAG 290

Other polymerization initiators can be used depending on the crosslinkable moiety in the $R^1$ groups on the cage-structured polyhedral oligomeric silsesquioxanes and the non-cage structured functionalized oligomeric siloxanes. For example, the polymerization initiator can be a free radical photoinitiator such as azobisisobutyronitrile (AIBN) (e.g., when $R^1$ contains a vinyl group), acylphosphine oxides such as diphenyl(2,4,6-trimethylbenzoyl)phosphine oxide (e.g., when $R^1$ contains a (meth)acrylate group), and various benzoin ethers, benzil ketals, α-dialkoxy-acetophenones, α-hydroxy-alkylphenones, and α-amino-alkylphenones known in the art. Photosensitizers such as benzophenone and 1-chloro-4-propoxy-9H-thioxanthen-9-one also can be used together with the photoinitiators.

As mentioned above, while dielectric and photoresist materials have been prepared by photocuring polyhedral oligomeric silsesquioxanes in the presence of a photoinitiator, the resulting materials were found to be ineffective in improving bias stability in a metal oxide transistor. The inventors unexpectedly discovered that the bias stability of the metal oxide transistor can markedly improve when the material also includes one or more thermosettable polymers, where the one or more thermosettable polymers collectively are present in an amount between about 1% by weight and about 20% by weight based on the total weight of the functionalized oligomeric siloxane component.

In preferred embodiments, the thermosettable polymers can include in their backbone, as pendant groups, and/or as terminal groups one or more functional groups that can react with the crosslinkable moiety of the $R^1$ group of the cage-structured polyhedral oligomeric silsesquioxane, and if present, the non-cage structured functionalized oligomeric siloxanes. For example, when $R^1$ comprises a cycloaliphatic epoxy moiety, the thermosettable polymers can include in their backbone, as pendant groups, and/or as terminal groups one or more functional groups that are known to be reactive with epoxy groups. Examples of functional groups that are known to react with epoxy groups include carboxylic acids, anhydrides, polyfunctional amines, phenols, alcohols, thiols, and epoxides.

In preferred embodiments, the thermosettable polymer can have one or more polar pendant groups grafted on its backbone. These polar pendant groups can have a dipole moment in a range between about 0.5 Debye and about 9.0 Debye, preferably between about 1.3 DeBye and about 5.0 Debye. Examples of polar pendant groups include, but are not limited to, cyanide groups, fluorinated groups, and others. For example, the thermosettable polymer can be a nitrile rubber, particularly an acrylonitrile butadiene rubber. The polar pendant groups can help to adjust the compatibility between the thermosettable polymer and the functionalized oligomeric siloxane component, as well as the solubility of the thermosettable polymer in the solvent. The polar pendant groups also can adjust the degree of interaction between the thermosettable polymer and the photoacid generator in the embodiments a photoacid generator is used.

In preferred embodiments, the thermosettable polymers can be elastomers characterized by (i) a low Young's modulus in a range from about 1.0 MPa to about 120.0 MPa, preferably, in a range from about 2.0 MPa to about 30.0 MPa, and/or (ii) a high elongation at break in a range from about 100% to about 800%. For example, the thermosettable polymers can be elastomers selected from polyisoprene, isobutylene isoprene rubber, polybutadiene, styrene-butadiene rubber, acrylonitrile butadiene rubber, hydrogenated nitrile rubbers, ethylene propylene rubber, ethylene propylene diene rubber, polyacrylic rubber, silicone rubber, fluorosilicone rubber, and ethylene-vinyl acetate.

In preferred embodiments, the thermosettable polymer can be selected from an amine or carboxylic acid end-capped acrylonitrile butadiene rubber, a maleic anhydride copolymer, a glycidyl functionalized poly(meth)acrylate, and combinations thereof.

Because of the presence of the organic $R^1$ and $R^2$ groups, the polyhedral oligomeric silsesquioxanes used in the present composition generally have satisfactory solubility in various common organic solvents, and can afford formulations that are suitable for solution-phase processes. Examples of organic solvents that can be used in the present composition include, but are not limited to, ketone solvents such as acetone, acetylacetone, methyl ethyl ketone, methyl isobutyl ketone, 2-butanone, 2-pentanone, 3-pentanone, 2-heptanone, 3-heptanone, cyclopentanone, and cyclohexanone; ester solvents such as ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate (PGMEA), methyl lactate, ethyl lactate and γ-butyrolactone; ether solvents such as diisopropyl ether, dibutyl ether, ethyl propyl ether, diethyl ether, bis(2-methoxyethyl) ether, dioxane, anisole, tetrahydrofuran, phenetole, and veratrole; and alcohol solvents such as methanol, ethanol, propanol, isopropanol, 1-butanol, 2-ethoxymethanol, 3-methoxypropanol, cyclopentanol, cyclohexanol, and heptanol. Preferred solvents can include diethyl carbonate, cyclopentanone, PGMEA, anisole, cyclohexanone, diacetone alcohol, tetramethylurea, methylbenzoate, γ-butyrolactone, ethylbenzoate, and propylene carbonate. Any of these solvents can be used either singly or in combination, or as mixtures with water.

In various embodiments, the solvent can be present in the composition in an amount between about 20% by weight and about 80% by weight, preferably between about 30% by weight and about 70% by weight based on the total weight of the composition. The functionalized oligomeric siloxane component generally can be present in the composition in an amount between about 40% and about 98%, preferably between about 50% and about 90%, based on 100% by weight solids of the composition. The thermosettable polymers collectively can be present in the composition in an amount between about 1% and about 40%, preferably between about 10% and about 30%, based on 100% by weight solids of the composition. The polymerization initiator can be present in the composition in an amount between about 1% and about 8%, preferably between about 3% and about 5%, based on 100% by weight solids of the composition.

In some embodiments, the present composition can further include a photocurable monomer or oligomer, present in an amount between about 5% to about 40%, preferably between about 10% and about 30%, based on 100% by weight solids of the composition. Examples of photocurable monomers and oligomers suitable for use in the present composition include, but are not limited to:

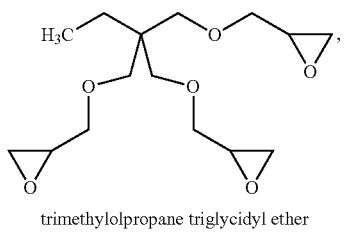

trimethylolpropane triglycidyl ether

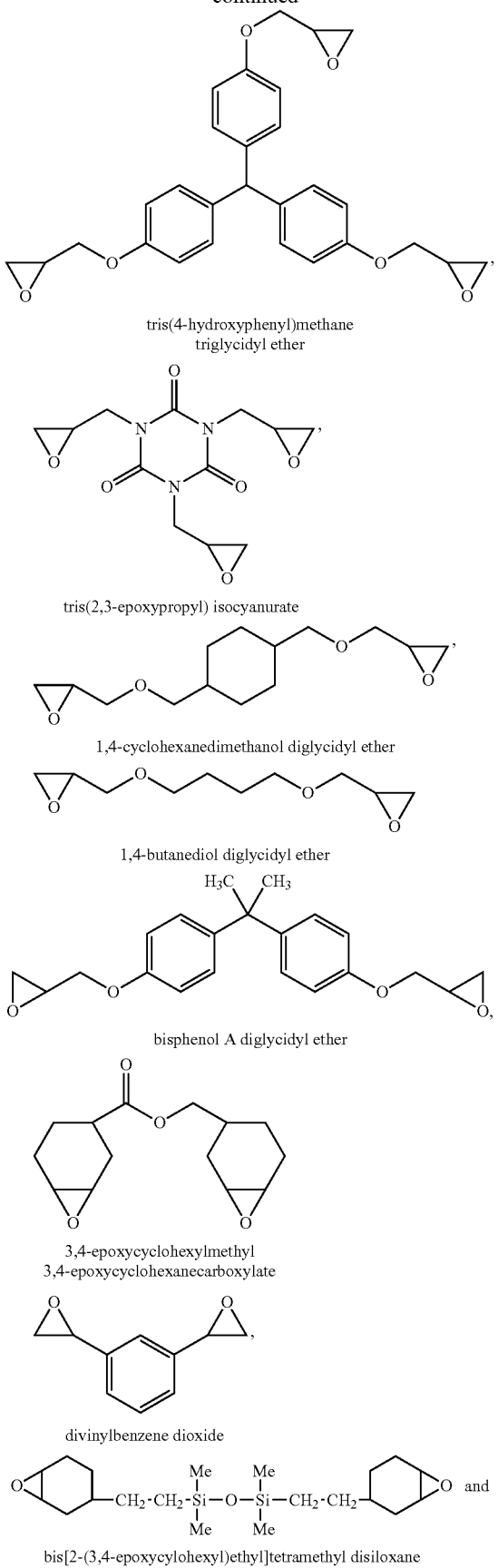

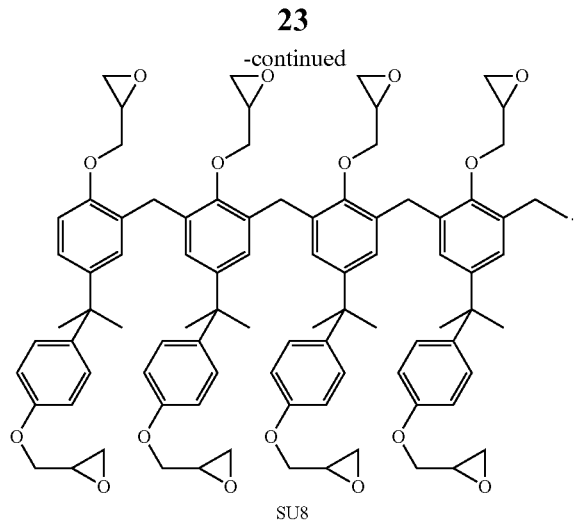

SU8

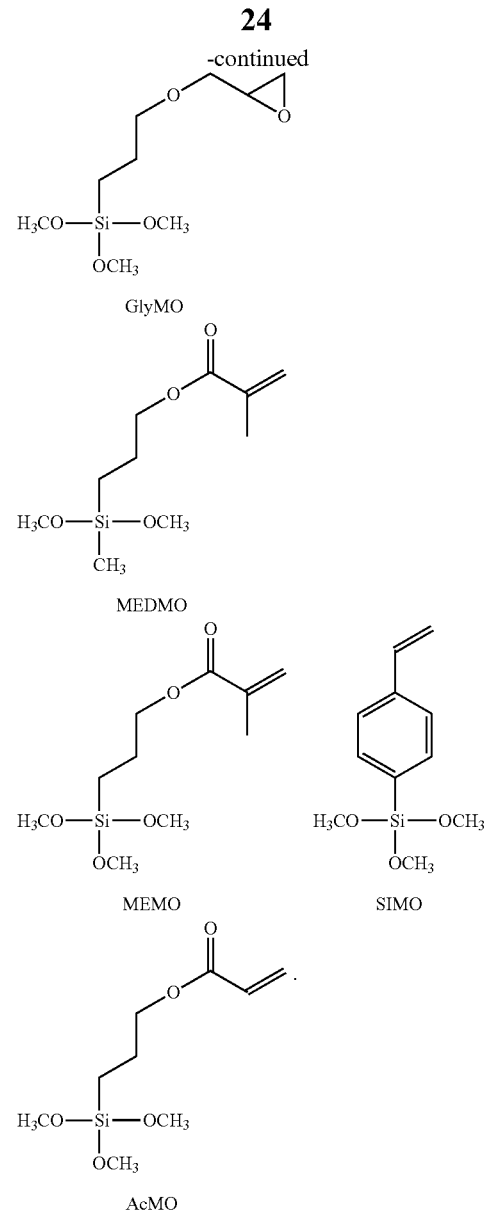

GlyMO

MEDMO

MEMO    SIMO

AcMO

In addition to the components described above, the present composition can include one or more additives, each present in an amount between about 1% and about 10%, preferably between about 3% and about 8%, based on 100% by weight solids of the composition. These additives can be selected from a rheology modifier, a leveling agent, a wetting agent, and an adhesion promoter.

For example, the present composition can include an ionic or non-ionic leveling agent. The leveling agent can confer improved coating properties to the present composition, for example, by decreasing surface tension and prevent surface defects in the resulting material. In preferred embodiments, the present composition includes a non-ionic leveling agent. Examples of non-ionic leveling agents include, but are not limited to, polysiloxane (silicone) leveling agents, fluorinated leveling agents, ethylene oxide-propylene oxide-block copolymer leveling agents. In particular embodiments, the non-ionic leveling agent can be a polysiloxane leveling agent. Examples of polysiloxane leveling agents include polyphenylmethyl siloxane, modified siloxane glycol-copolymer (e.g., EDAPLAN® LA 411 available from Münzing Chemie GmbH), and other modified organo polysiloxanes (e.g., EDAPLAN® LA 413 available from Münzing Chemie GmbH). Acrylic leveling agents (e.g., BYK® 368 P available from BYK Chemie GmbH) also can be useful.

The present composition can include a functionalized trialkoxy silane adhesion promoter. Particularly, the trialkoxy silane can be functionalized with a reactive group compatible with the crosslinkable moiety of the $R^1$ group in the polyhedral oligomeric silsesquioxane. For example, when $R^1$ comprises a cycloaliphatic epoxy moiety, the trialkoxy silane can include a functional group known to be reactive with epoxy groups. Examples of suitable functionalized trialkoxy silane adhesion promoter include:

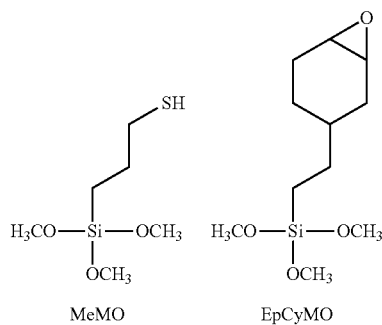

MeMO    EpCyMO

The composition described herein can be solution-processed into films having a thickness in the range of about 1 μm to about 50 μm, where the films subsequently can be crosslinked via actinic (e.g., UV) radiation, into mechanically robust and ambient-stable materials suitable for use as a permanent layer in various electronic, optical, and optoelectronics devices. For example, the present materials can provide a photopatternable film having a thickness ranging from about 2 μm to about 25 μm, from about 2 μm to about 20 μm, from about 2 μm to about 15 μm, from about 2 μm to about 10 μm, and from about 3 μm to about 8 μm. The present material can be photopatterned on the micrometer-range, and can have a contract of about 0.2 to about 10.

The photopatternable materials according to the present teachings can be used (either by itself or with at least one other dielectric material) as the dielectric layer in a thin film transistor, as a passivation material (for example, to encapsulate the source and drain electrodes in a transistor), or as an etch-stop material (for example, to protect an underlying metal oxide semiconductor layer during the patterning (etching) step of the metal layer on top to define source and drain electrodes).

When used as a dielectric material, the present materials can exhibit a wide range of desirable properties and characteristics including, but not limited to, low leakage current densities, high breakdown voltages, low hysteresis, large capacitance values, uniform film thickness, solution-processability, fabricability at low temperatures and/or atmospheric pressures, thermal stability, air and moisture stability, resistance to harsh reagents, and/or compatibility with diverse gate materials and/or semiconductors. When used as passivation or interfacial materials, the present materials can exhibit desirable properties and characteristics including, but not limited to, high decomposition temperature, high optical clarity, low shrinkage, low moisture absorption, low oxygen penetration, uniform film thickness, solution-processability, fabricability at low temperatures and/or atmospheric pressures, and good adhesion to adjacent materials. When used as etch-stop materials, the present materials can exhibit desirable properties and characteristics including, but not limited to, chemical resistance to common wet etchants, photopatternability (without the need for photoresist, hence reducing manufacturing steps), high decomposition temperature, high optical clarity, low shrinkage, low moisture absorption, low oxygen penetration, uniform film thickness, solution-processability, fabricability at low temperatures and/or atmospheric pressures, and good adhesion to diverse adjacent materials (metal oxides, metals or metal alloys, and organic materials).

As used herein, "solution-processable" or "solution-processed" refers to the ability of a composition to be processed via various solution-phase processes. A solution-processable composition can be deposited on a substrate, such as an electrically conductive material (e.g., source, drain, or gate electrodes in a transistor) or a semiconductor material (e.g., the charge-carrying layer in a transistor), via various solution-phase deposition methods known in the art. In various embodiments, the solution-phase process can be selected from spin-coating, slot coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Spin-coating involves applying an excess amount of the coating solution onto the substrate, then rotating the substrate at high speed to spread the fluid by centrifugal force. The thickness of the resulting film prepared by this technique can be dependent on the spin-coating rate, the concentration of the solution, as well as the solvent used. Printing can be performed, for example, with a rotogravure printing press, a flexoprinting press, pad printing, screen printing or an ink jet printer. The thickness of the resulting film as processed by these printing methods can be dependent on the concentration of the solution, the choice of solvent, and the number of printing repetitions. Ambient conditions such as temperature, pressure, and humidity also can affect the resulting thickness of the film. Depending on the specific printing techniques used, printing quality can be affected by different parameters including, but not limited to, rheological properties of the formulations/compositions such as tension energy and viscosity.

Films according to the present teachings can be photopatterned directly (without using a photoresist). Accordingly, a patterned layer can be formed by depositing a composition according to the present teachings to provide an uncrosslinked film, subjecting the uncrosslinked film to actinic radiation in an imagewise pattern such that the components in the photopatternable composition in exposed areas becomes crosslinked; and removing the unexposed areas (which remain uncrosslinked and soluble). More specifically, the process can include depositing a composition described herein to form a film of desired thickness, exposing the film to radiation (e.g., in the G (435.8 nm), H (404.7 nm), or I (365.4 nm) line of the spectrum) through a photomask (one having the desired imagewise pattern) to provide insoluble (e.g., crosslinked) areas and soluble (e.g., uncrosslinked) areas, and stripping the soluble areas. Depending on the formulations, films according to the present teachings can be negative-tone or positive-tone, and can be developed by either organic solvents or aqueous solutions. Subsequent to the formation of the crosslinked matrix, the film material of the present teachings can be subjected to further patterning and processing steps, by which additional layers, including additional dielectric, semiconductor and/or conducting layers, can be formed on top of the material.

The present teachings further provide articles of manufacture, for example, composites, that includes a material of the present teachings and a substrate component and/or a semiconductor component. The substrate component can be selected from, but is not limited to, doped silicon, an indium tin oxide (ITO), ITO-coated glass, ITO-coated polyimide or other plastics, copper, molybdenum, chromium, aluminum or other metals alone or coated on a polymer or other substrate. The composite can include a semiconductor component, particularly, a metal oxide semiconductor such as IGZO.

Particularly, the present material can be used, in whole or in part, as the etch-stop layer of a metal oxide thin film transistor, preferably, an IGZO thin film transistor, wherein the etch-stop layer comprises the present material and is positioned directly adjacent to a metal oxide semiconductor layer.

A typical thin film transistor (TFT) includes a number of layers and can be configured in various ways. For example, a TFT can include a substrate, a dielectric layer, a semiconductor layer, source and drain electrodes in contact with the semiconductor layer, and a gate electrode adjacent to the dielectric layer. When a potential is applied on the gate electrode, charge carriers are accumulated in the semiconductor layer at an interface with the dielectric layer. As a result, a conductive channel is formed between the source electrode and the drain electrode and a current will flow if a potential is applied to the drain electrode.

FIG. 1 illustrates two possible structures of a bottom-gate top-contact metal oxide TFT, wherein the source and drain electrodes are defined on top of the metal oxide (MO) semiconductor layer. FIG. 1a shows an etch stop (ES) structure, and FIG. 1b shows a back-channel-etch (BCE) structure. As shown, in the ES structure, an etch stop layer is deposited on top of the metal oxide layer to protect the metal oxide layer from the subsequent processing (e.g., patterning) steps used to form the source and drain electrodes. In the BCE structure, the source and drain electrodes are directly patterned (usually via dry etching) above the metal oxide layer. A high-temperature annealing step often is performed afterwards to repair the damage introduced during the patterning step. In both structures, a passivation layer can be deposited over the source and drain electrodes and the metal oxide channel.

Accordingly, an aspect of the present teachings relates to a method of fabricating a metal oxide thin film transistor, wherein the passivation layer comprises the material described herein.

Figure 2:
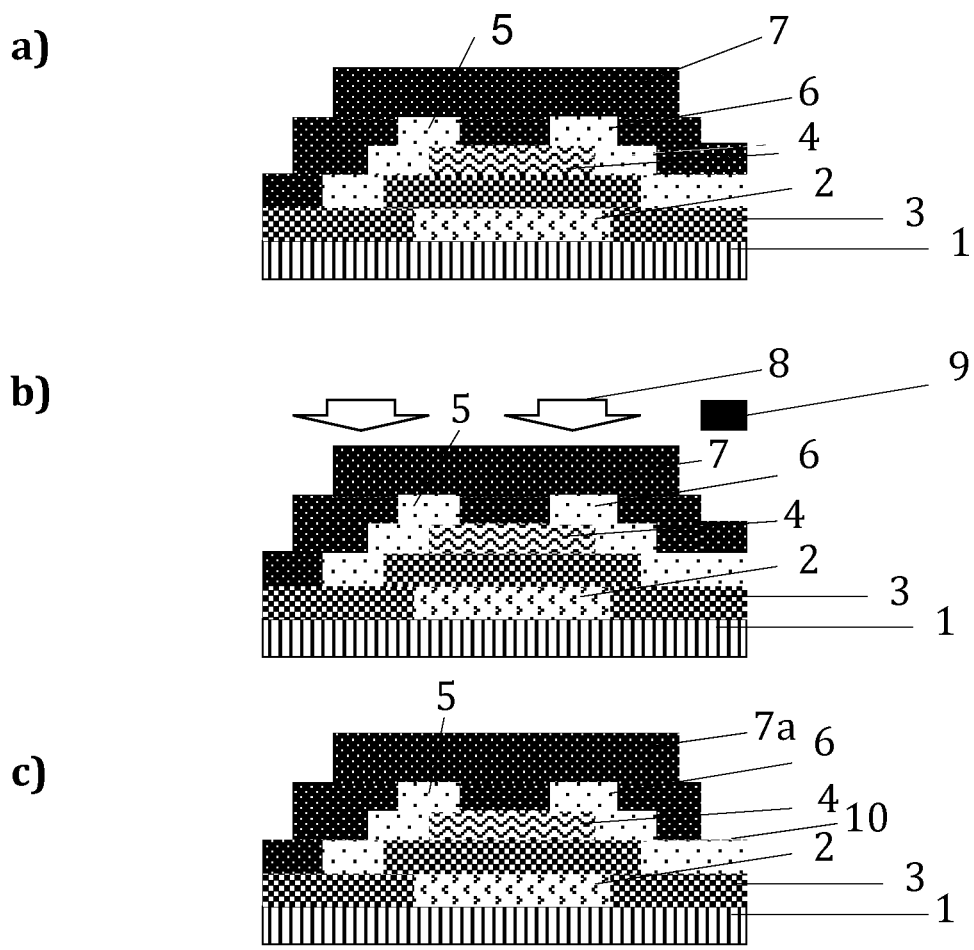
FIG. 2 illustrates the process of fabricating a metal oxide transistor with a passivation layer using a composition according to the present teachings.

FIG. 2 illustrates how a passivation layer comprising the present material can be formed and photopatterned in a back-channel-etch (BCE) type bottom-gate top-contact metal oxide TFT, which before passivation, includes a substrate (1), a gate electrode (2), a gate dielectric layer (3), a metal oxide semiconductor layer (4), and source and drain electrodes (5, 6). First, the present composition is deposited, for example, by spin-coating, over the source and drain electrodes and the metal oxide semiconductor layer (FIG. 2a). After deposition, this polymeric layer (7) is exposed to UV radiation (8) through a photomask (9) to induce photocrosslinking in the exposed areas. In FIG. 2b, the entire passivation layer (7a) is crosslinked but for an area where a via hole is to be located. The unexposed area is developed to form the via hole (10) (FIG. 2c).

Various embodiments of the transistors described herein can be arranged in an array which can be used as switching devices or peripheral drivers in active matrix liquid crystal displays (AMLCDs) and as pixel drivers for active matrix organic light-emitting diodes (AMOLEDs).

While the present hybrid materials have been shown to function particularly well as passivation components in a metal oxide transistor, they also can be used, as a passivation component and/or a dielectric component, in other semiconductor devices, including an organic thin film transistor.

The present teachings further relate to a solution-processable composition for preparing a photopatternable material, where the composition includes a crosslinkable polymer and one or more cage-structured polyhedral oligomeric silsesquioxanes described herein in a solvent. In preferred embodiments, the crosslinkable polymer is photocrosslinkable and the cage-structured polyhedral oligomeric silsesquioxane is functionalized with at least one photocrosslinkable moiety. In more preferred embodiments, both the crosslinkable polymer and the cage-structured polyhedral oligomeric silsesquioxane is functionalized with one or more dienoic cinnamate groups. The composition otherwise can be absent of any photosensitive additives including, but not limited to, any photoacid generators, photoinitiators, or photosensitizers.

The following examples are provided to illustrate further and to facilitate the understanding of the present teachings and are not in any way intended to limit the invention.

Example 1

Formulations

Table 1 provides formulations according to the present teachings as well as comparative formulations without any thermosettable polymers, with an epoxy-functionalized siloxane that is not POSS (HM1), and with an epoxy-functionalized polymer instead of POSS (D.E.N. 439):

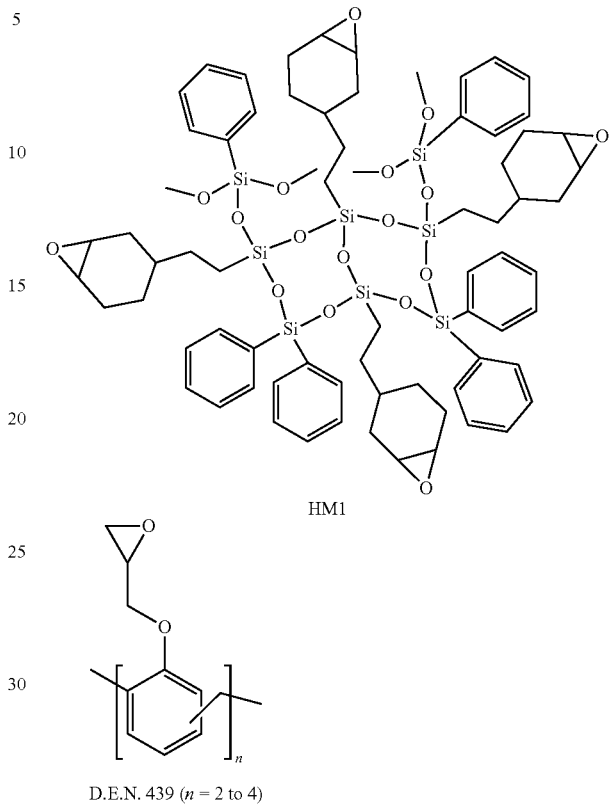

D.E.N. 439 (n = 2 to 4)

The formulations were investigated in the subsequent examples to demonstrate the unexpected properties of the present formulations. The percentages provided herein are based upon the total weight of solids in the composition. The percentages in parenthesis indicate the weight percentage based upon the entire composition (i.e., including the solvent).

TABLE 1

| Formulation | Compositions |
| --- | --- |
| Comparative A | 96% ECPOSS (Hybrid Plastic EP0408), 2% (0.67%) Irgacure PAG290 (BASF), 2% (0.67%) polyphenylmethylsiloxane (PPMS), in cyclopentanone |
| Comparative B | 94% Novolac Epoxy (Dow Chemical, D.E.N. 438), 1% polyphenylmethylsiloxane (PPMS), 5% N-hydroxynaphthalimide triflate (NIT), in cyclopentanone |
| Comparative C | 96% non-cage structured functionalized oligomeric siloxane (HM1), 2% polyphenylmethylsiloxane (PPMS), 2% N-hydroxynaphthalimide triflate (NIT), in cyclopentanone |
| 1 | 87% ECPOSS (Hybrid Plastic EP0408), 8.7% carboxyl-terminated butadiene and acrylonitrile copolymers (CTBN), 1.8% Irgacure PAG290 (BASF), 1.8% polyphenylmethylsiloxane (PPMS), 0.7% 2-(3,4-epoxycyclohexyl)-ethyltrimethoxysilane (ECTMS, Gelest, Inc. SIE4670.0), in cyclopentanone |
| 2 | 87% ECPOSS (Hybrid Plastic EP0408), 4.4% carboxyl-terminated butadiene and acrylonitrile copolymers (CTBN), 4.4% poly(styrene-co-maleic anhydride) (PSMA, aldrich 442402-250g-A), 1.7% Irgacure PAG290 (BASF), 1.7% polyphenylmethylsiloxane (PPMS), 0.8% 2-(3,4-epoxycyclohexyl)-ethyltrimethoxysilane (ECTMS, Gelest, Inc. SIE4670.0), in cyclopentanone |
| 3 | 88% ECPOSS (Hybrid Plastic EP0408), 8.8% poly(maleic anhydride-alt-1-octadecene) (PMAO, Aldrich 419117-250g, $M_n$ 30,000-50,000, acid number 310-315 mg KOH/g), 1.6% Irgacure PAG290 (BASF), 1.6% polyphenylmethylsiloxane (PPMS), in cyclopentanone |

TABLE 1-continued

| Formulation | Compositions |
|---|---|
| 4 | 88% ECPOSS (Hybrid Plastic EP0408), 8.8% poly(styrene-co-maleic anhydride) (PSMA, Aldrich 442402-250g-A, $M_n$~1,900, acid number 265-305 mg KOH/g), 1.6% Irgacure PAG290 (BASF), 1.6% polyphenylmethylsiloxane (PPMS), in cyclopentanone |
| 5 | 88% ECPOSS (Hybrid Plastic EP0408), 8.8% carboxyl-terminated butadiene and acrylonitrile copolymers (CTBN), 1.6% Irgacure PAG290 (BASF), 1.6% polyphenylmethylsiloxane (PPMS), in cyclopentanone |
| 6 | 87% ECPOSS (Hybrid Plastic EP0408), 2.2% carboxyl-terminated butadiene and acrylonitrile copolymers (CTBN), 6.6% poly(glycidyl methacrylate) (PGMA, $M_n$ = 7.5 k, $M_w/M_n$ = 1.5), 1.7% Irgacure PAG290 (BASF), 1.7% polyphenylmethylsiloxane (PPMS), 0.8% 2-(3,4-epoxycyclohexyl)-ethyltrimethoxysilane (ECTMS, Gelest, Inc. SIE4670.0), in cyclopentanone |
| 7 | 87% ECPOSS (Hybrid Plastic EP0408), 8.7% poly(glycidyl methacrylate) (PGMA, $M_n$ = 7.5 k, $M_w/M_n$ = 1.5), 1.8% Irgacure PAG290 (BASF), 1.8% polyphenylmethylsiloxane (PPMS), 0.7% 2-(3,4-epoxycyclohexyl)-ethyltrimethoxysilane (ECTMS, Gelest, Inc. SIE4670.0), in cyclopentanone |

Example 2

Characterization of Comparative Formulation A

Comparative formulation A (containing 96% epoxycyclohexyl ethyl POSS® ("ECPOSS", Hybrid Plastic EP0408, cage content≥50%), 2% Irgacure® PAG290 (BASF), and 2% polyphenylmethylsiloxane (PPMS) in cyclopentanone) was spin-coated at various spin rates onto silicon substrates following a soft baking step at 110° C. for 1 minute on a hot plate under ambient conditions to provide photocurable films. The films were then flood-cured with UV I-line (300 mJ/cm$^2$) exposure and the thickness of each film was measured using a profilometer after a 5-min baking step at 110° C. on a hot plate under ambient conditions. The film thickness ranges from about 1.5 µm to about 4 µm using a spin rate ranging from about 3000 rpm to about 750 rpm.

Film materials deposited from comparative formulation A were found to have reasonable thermal stability. A thickness change of about −5%, −9%, and −13%, respectively, was observed after the film materials were subjected to a high-temperature baking step at 250° C. for 60 minutes, 300° C. for 60 minutes, and 350° C. for 30 minutes, post-photocuring.

Film materials deposited from comparative formulation A also showed good photolithographic properties. Comparative formulation A was spin-coated at 1000 rpm onto silver-coated glass substrates following a soft baking step at 110° C. for 1 minute on a hot plate under ambient conditions to give film materials of about 3 µm. The film materials were then photocured with UV I-line (40 mJ/cm$^2$) using a via-hole mask and developed using propylene glycol methyl ether acetate (PG-MEA) as the stripping solvent. The via-hole pattern was then transferred to the silver layer using a silver etchant and the ECPOSS film as a mask. The size of each via hole is about 8 µm and good contrast was obtained.

Example 3

Comparative Formulation A as Passivation Material for IGZO Transistor

Back-channel-etch (BCE) TFTs with exposed IGZO backsurface was fabricated using a standard photolithography process. Specifically, comparative formulation A was spin-coated at 1000 rpm onto the back surface of the IGZO semiconductor. The devices were soft-baked at 110° C. for 1 minute on a hot plate under ambient conditions to give a film of about 3 µm in thickness as the passivation layer. The passivated TFTs were then flood-cured with UV I-line exposure (300 mJ/cm$^2$), followed by a 250° C. baking step in a nitrogen flow oven for 30 minutes.

Figure 3:
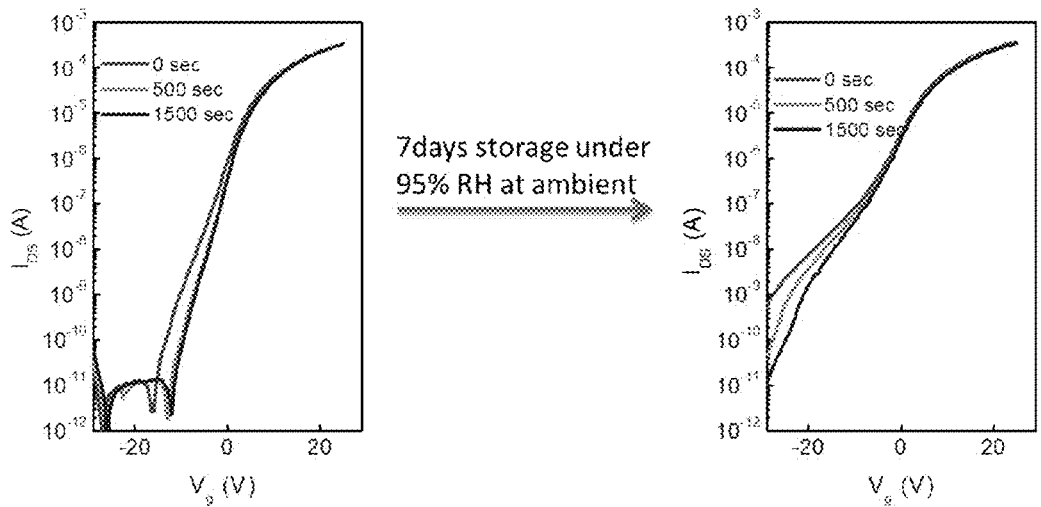
FIG. 3 shows the transfer characteristics of a comparative BCE IGZO TFT having a passivation layer prepared from comparative formulation A a) when subjected to a positive gate bias stress of 30V for 500 seconds under 80° C., c) that has been stored for 7 days under 50 RH % when subjected to a positive gate bias stress of 30V for 1500 seconds under 80° C.

To test the long-term stability of the devices, an acceleration test was performed by taking the $I_dV_g$ curve at 500-second intervals, between which the gate was biased at +30V for 500 seconds at 80° C. (PTBS). Although the passivated devices did not exhibit a significant bias stress effect initially, their transfer characteristics degraded considerably after storage under 95 RH % for 7 days as shown in FIG. 3.

Example 4

Characterization of Formulations According to the Present Teachings

Formulation 1 (containing 87% epoxycyclohexyl ethyl POSS® ("ECPOSS", Hybrid Plastic EP0408, cage content≥50%), 8.7% carboxyl-terminated butadiene and acrylonitrile copolymers (CTBN), 1.8% Irgacure® PAG290 (BASF), 1.8% polyphenylmethylsiloxane (PPMS), and 0.7% 2-(3,4-epoxycyclohexyl)-ethyltrimethoxysilane (ECTMS, Gelest, Inc. SIE4670.0) in cyclopentanone) was spin-coated at various spin rates onto silicon substrates following a soft baking step at 110° C. for 1 minute on a hot plate under ambient conditions to provide photocurable films. The films were then flood-cured with UV I-line (300 mJ/cm$^2$) exposure and the thickness of each film was measured using a profilometer after a 5-min baking step at 110° C. on a hot plate under ambient conditions. The film thickness ranges from about 2.0 µm to about 4.5 µm using a spin rate ranging from about 4000 rpm to about 750 rpm.

Film materials deposited from formulation 1 were found to have reasonable thermal stability. A thickness change of about −1% and −9%, respectively, was observed after the film materials were subjected to a high-temperature baking step at 250° C. for 30 minutes and 300° C. for 30 minutes, post-photocuring.

Film materials deposited from formulation 1 also showed good photolithographic properties. Formulation 1 was spin-coated at 1000 rpm onto SiO$_2$ substrates following a soft baking step at 110° C. for 1 minute on a hot plate under ambient conditions to give film materials of about 3.5 µm. The film materials were then photocured with UV I-line (150 mJ/cm$^2$) using a via-hole mask and developed using propylene glycol methyl ether acetate (PGMEA) as the stripping solvent. The size of each via hole is about 8 μm and good contrast was obtained.

Example 5

Formulations According to the Present Teachings as Passivation Material for IGZO Transistor

Example 5a

Formulation 1 as Passivation Material for IGZO Transistor

Back-channel-etch (BCE) TFTs with exposed IGZO back-surface was fabricated using a standard photolithography process. Specifically, Formulation 1 was spin-coated at 1000 rpm onto the back surface of the IGZO semiconductor. The devices were soft-baked at 110° C. for 1 minute on a hot plate under ambient conditions to give a film of about 3.5 μm in thickness as the passivation layer. The passivated TFTs were then flood-cured with UV I-line exposure (300 mJ/cm$^2$), followed by a baking step at 250° C. in a nitrogen flow oven for 30 minutes.

Figure 4:
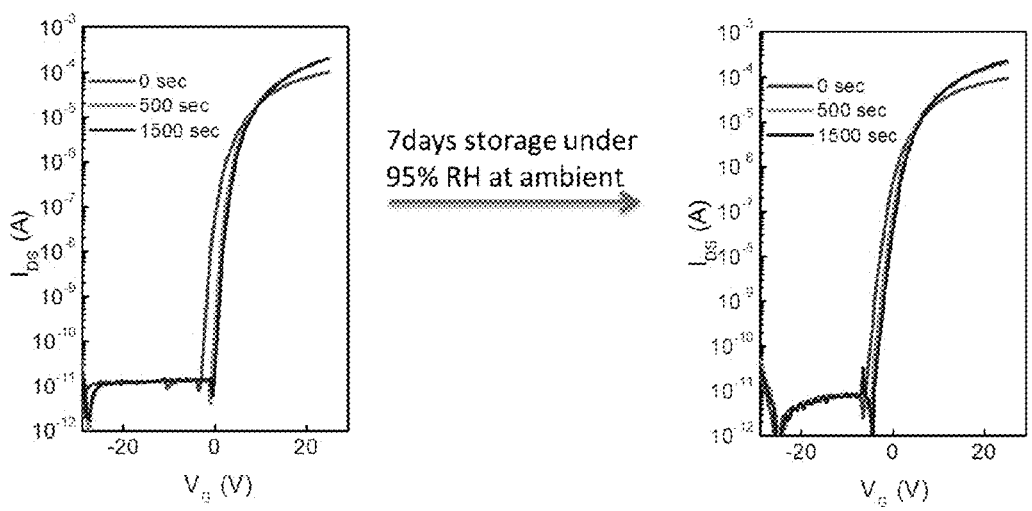
FIG. 4 shows the transfer characteristics of a BCE IGZO TFT having a passivation layer prepared from a formulation according to the present teachings a) when subjected to a positive gate bias stress of 30V for 500 seconds under 80° C., c) that has been stored for 7 days under 50 RH % when subjected to a positive gate bias stress of 30V for 1500 seconds under 80° C.

To test the long-term stability of the devices, an acceleration test was performed by taking the $I_dV_g$ curve at 500-second intervals, between which the gate was biased at +30V for 500 seconds at 80° C. (PTBS). As shown in FIG. 4, even after storage under 95 RH % for 7 days, no significant degradation of the transfer characteristics of the passivated devices was observed, showing marked improvement over the comparative devices (c.f. FIG. 3).

Example 5b

Formulation 2 as Passivation Material for IGZO Transistor

Back-channel-etch (BCE) TFTs with exposed IGZO back-surface was fabricated using a standard photolithography process. Specifically, Formulation 2 (containing 87% epoxy-cyclohexyl ethyl POSS® ("ECPOSS", Hybrid Plastic EP0408, cage content≥50%), 4.4% carboxyl-terminated butadiene and acrylonitrile copolymers (CTBN), 4.4% poly (styrene-co-maleic anhydride) (PSMA, aldrich 442402-250g-A), 1.7% Irgacure® PAG290 (BASF), 1.7% polyphenylmethylsiloxane (PPMS), and 0.8% 2-(3,4-epoxycyclohexyl)-ethyltrimethoxysilane (ECTMS, Gelest, Inc. SIE4670.0) in cyclopentanone) was spin-coated at 1000 rpm onto the back surface of the IGZO semiconductor. The devices were soft-baked at 110° C. for 1 minute on a hot plate under ambient conditions to give a film of about 3.5 μm in thickness as the passivation layer. The passivated TFTs were then flood-cured with UV I-line exposure (300 mJ/cm$^2$), followed by a baking step at 250° C. in a nitrogen flow oven for 30 minutes.

Figure 5:
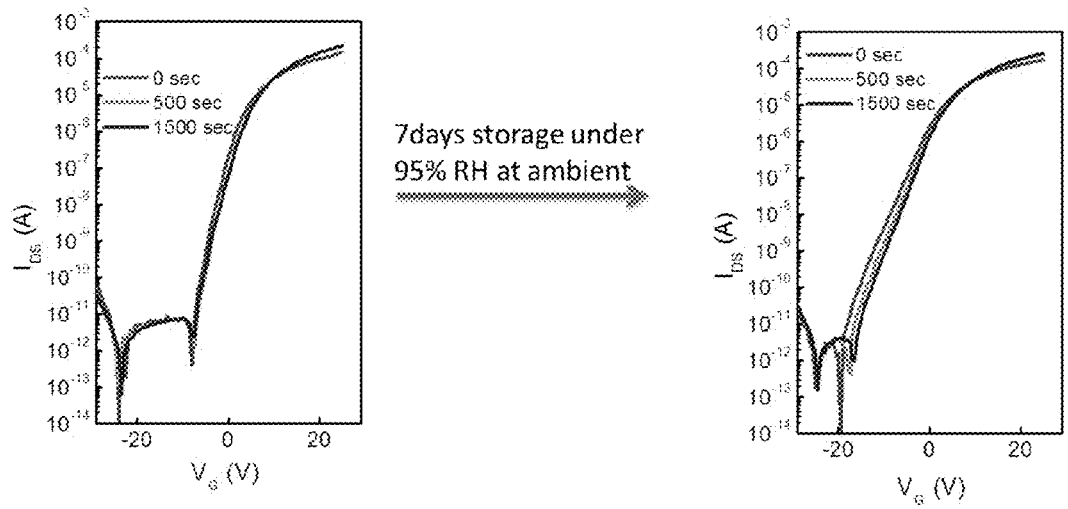
FIG. 5 shows the transfer characteristics of a BCE IGZO TFT having a passivation layer prepared from a formulation according to the present teachings a) when subjected to a positive gate bias stress of 30V for 500 seconds under 80° C., c) that has been stored for 7 days under 50 RH % when subjected to a positive gate bias stress of 30V for 1500 seconds under 80° C.

To test the long-term stability of the devices, an acceleration test was performed by taking the $I_dV_g$ curve at 500-second intervals, between which the gate was biased at +30V for 500 seconds at 80° C. (PTBS). As shown in FIG. 5, even after storage under 95 RH % for 7 days, no significant degradation of the transfer characteristics of the passivated devices was observed, showing marked improvement over the comparative devices (c.f. FIG. 3).

Example 5c

Formulation 3 as Passivation Material for IGZO Transistor

Back-channel-etch (BCE) TFTs with exposed IGZO back-surface was fabricated using a standard photolithography process. Specifically, Formulation 3 (containing 88% epoxy-cyclohexyl ethyl POSS® ("ECPOSS", Hybrid Plastic EP0408, cage content≥50%), 8.8% poly(maleic anhydride-alt-1-octadecene) (PMAO, aldrich 419117-250g, $M_n$ 30,000-50,000, acid number 310-315 mg KOH/g), 1.6% Irgacure® PAG290 (BASF), and 1.6% polyphenylmethylsiloxane (PPMS) in cyclopentanone) was spin-coated at 1000 rpm onto the back surface of the IGZO semiconductor. The devices were soft-baked at 110° C. for 1 minute on a hot plate under ambient conditions to give a film of about 3.5 μm in thickness as the passivation layer. The passivated TFTs were then flood-cured with UV I-line exposure (300 mJ/cm$^2$), followed by a baking step at 250° C. in a nitrogen flow oven for 30 minutes.

Figure 6:
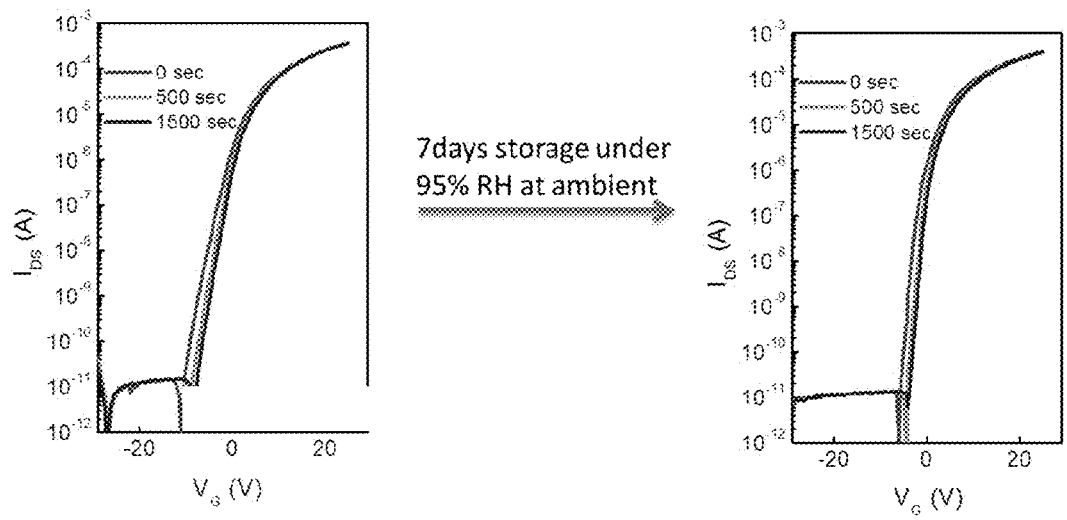
FIG. 6 shows the transfer characteristics of a BCE IGZO TFT having a passivation layer prepared from a formulation according to the present teachings a) when subjected to a positive gate bias stress of 30V for 500 seconds under 80° C., c) that has been stored for 7 days under 50 RH % when subjected to a positive gate bias stress of 30V for 1500 seconds under 80° C.

To test the long-term stability of the devices, an acceleration test was performed by taking the $I_dV_g$ curve at 500-second intervals, between which the gate was biased at +30V for 500 seconds at 80° C. (PTBS). As shown in FIG. 6, even after storage under 95 RH % for 7 days, no significant degradation of the transfer characteristics of the passivated devices was observed, showing marked improvement over the comparative devices (c.f. FIG. 3).

Example 5d

Formulation 4 as Passivation Material for IGZO Transistor

Back-channel-etch (BCE) TFTs with exposed IGZO back-surface was fabricated using a standard photolithography process. Specifically, Formulation 4 (containing 88% epoxy-cyclohexyl ethyl POSS® ("ECPOSS", Hybrid Plastic EP0408, cage content≥50%), 8.8% poly(styrene-co-maleic anhydride) (PSMA, aldrich 442402-250g-A, $M_n$~1,900, acid number 265-305 mg KOH/g), 1.6% Irgacure® PAG290 (BASF), and 1.6% polyphenylmethylsiloxane (PPMS) in cyclopentanone) was spin-coated at 1000 rpm onto the back surface of the IGZO semiconductor. The devices were soft-baked at 110° C. for 1 minute on a hot plate under ambient conditions to give a film of about 3.5 μm in thickness as the passivation layer. The passivated TFTs were then flood-cured with UV I-line exposure (300 mJ/cm$^2$), followed by a baking step at 250° C. in a nitrogen flow oven for 30 minutes.

Figure 7:
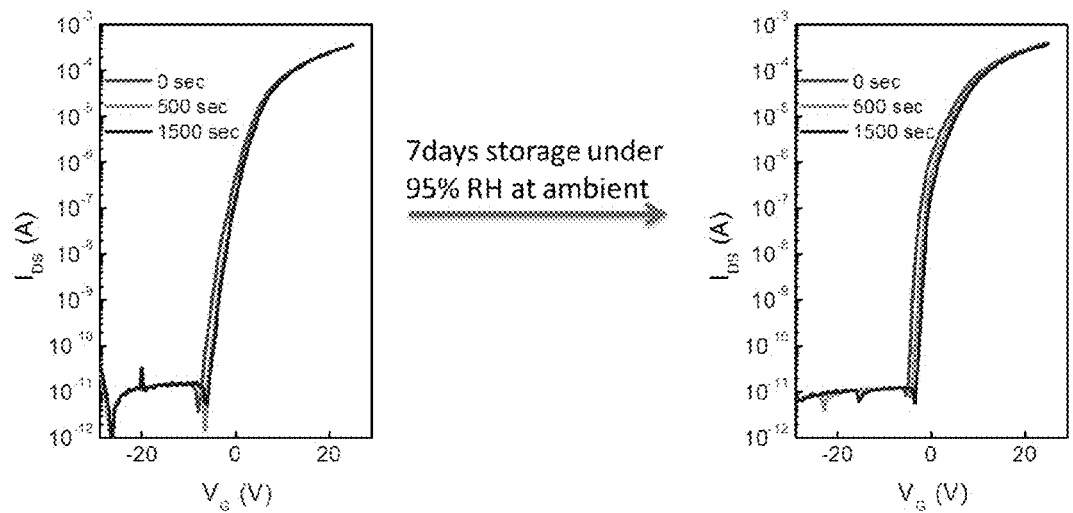
FIG. 7 shows the transfer characteristics of a BCE IGZO TFT having a passivation layer prepared from a formulation according to the present teachings a) when subjected to a positive gate bias stress of 30V for 500 seconds under 80° C., c) that has been stored for 7 days under 50 RH % when subjected to a positive gate bias stress of 30V for 1500 seconds under 80° C.

To test the long-term stability of the devices, an acceleration test was performed by taking the $I_dV_g$ curve at 500-second intervals, between which the gate was biased at +30V for 500 seconds at 80° C. (PTBS). As shown in FIG. 7, even after storage under 95 RH % for 7 days, no significant degradation of the transfer characteristics of the passivated devices was observed, showing marked improvement over the comparative devices (c.f. FIG. 3).

Example 5e

Formulation 5 as Passivation Material for IGZO Transistor

Back-channel-etch (BCE) TFTs with exposed IGZO back-surface was fabricated using a standard photolithography process. Specifically, Formulation 5 (containing 88% epoxycyclohexyl ethyl POSS® ("ECPOSS", Hybrid Plastic EP0408, cage content≥50%), 8.8% carboxyl-terminated butadiene and acrylonitrile copolymers (CTBN), 1.6% Irgacure® PAG290 (BASF), and 1.6% polyphenylmethylsiloxane (PPMS) in cyclopentanone) was spin-coated at 1000 rpm onto the back surface of the IGZO semiconductor. The devices were soft-baked at 110° C. for 1 minute on a hot plate under ambient conditions to give a film of about 3.5 µm in thickness as the passivation layer. The passivated TFTs were then flood-cured with UV I-line exposure (300 mJ/cm$^2$), followed by a baking step at 250° C. in a nitrogen flow oven for 30 minutes.

Figure 8:
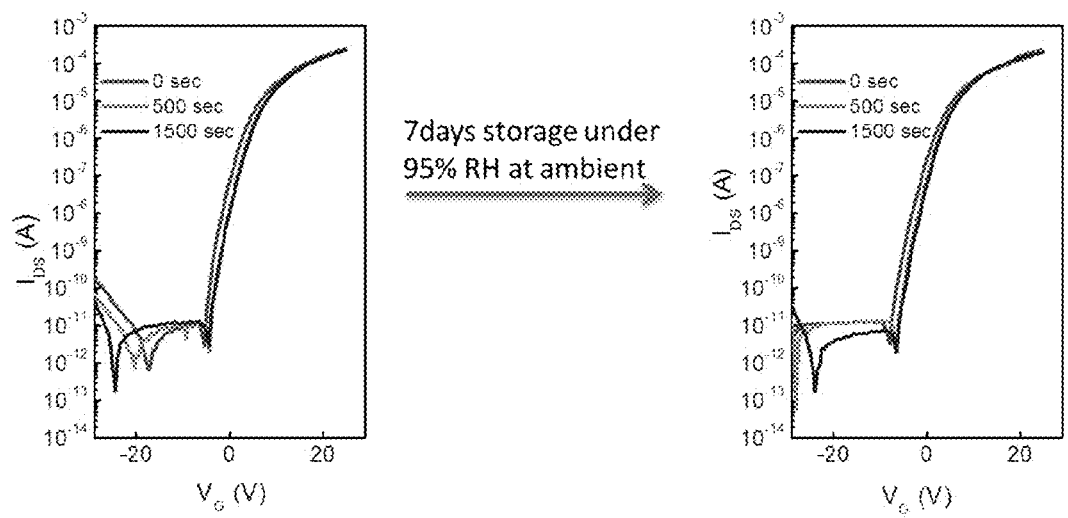
FIG. 8 shows the transfer characteristics of a BCE IGZO TFT having a passivation layer prepared from a formulation according to the present teachings a) when subjected to a positive gate bias stress of 30V for 500 seconds under 80° C., c) that has been stored for 7 days under 50 RH % when subjected to a positive gate bias stress of 30V for 1500 seconds under 80° C.

To test the long-term stability of the devices, an acceleration test was performed by taking the $I_dV_g$ curve at 500-second intervals, between which the gate was biased at +30V for 500 seconds at 80° C. (PTBS). As shown in FIG. 8, even after storage under 95 RH % for 7 days, no significant degradation of the transfer characteristics of the passivated devices was observed, showing marked improvement over the comparative devices (c.f. FIG. 3).

Example 5f

Formulation 6 as Passivation Material for IGZO Transistor

Back-channel-etch (BCE) TFTs with exposed IGZO back-surface was fabricated using a standard photolithography process. Specifically, Formulation 6 (containing 87% epoxycyclohexyl ethyl POSS® ("ECPOSS", Hybrid Plastic EP0408, cage content≥50%), 2.2% carboxyl-terminated butadiene and acrylonitrile copolymers (CTBN), 6.6% poly(glycidyl methacrylate) (PGMA, $M_n$=7.5 k, $M_w/M_n$=1.5), 1.7% Irgacure PAG290 (BASF), 0.66% polyphenylmethylsiloxane (PPMS), and), 0.8% 2-(3,4-epoxycyclohexyl)-ethyltrimethoxysilane (ECTMS, Gelest, Inc. SIE4670.0) in cyclopentanone) was spin-coated at 1000 rpm onto the back surface of the IGZO semiconductor. The devices were soft-baked at 110° C. for 1 minute on a hot plate under ambient conditions to give a film of about 3.5 µm in thickness as the passivation layer. The passivated TFTs were then flood-cured with UV I-line exposure (300 mJ/cm$^2$), followed by a baking step at 250° C. in a nitrogen flow oven for 30 minutes.

Figure 9:
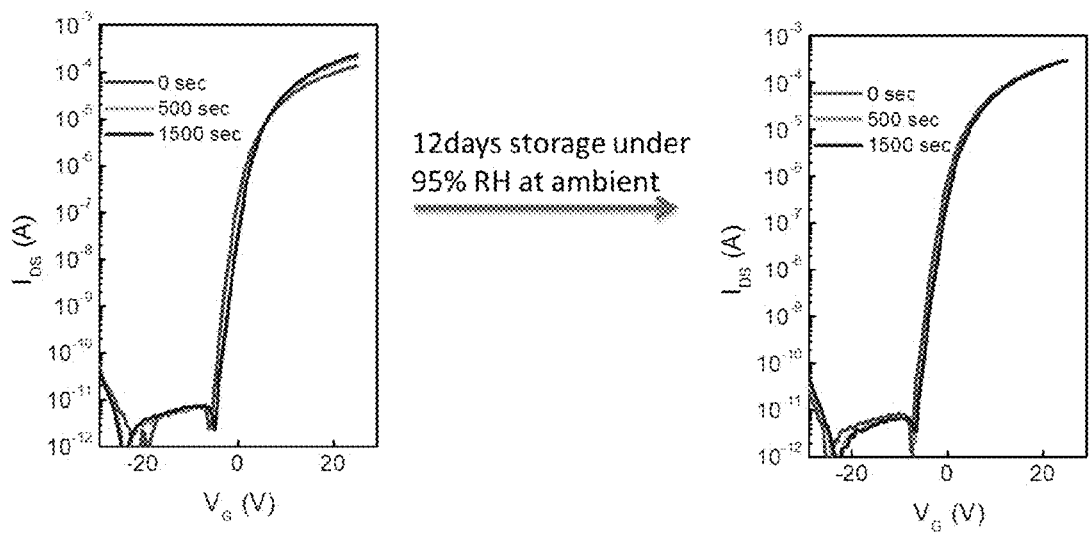
FIG. 9 shows the transfer characteristics of a BCE IGZO TFT having a passivation layer prepared from a formulation according to the present teachings a) when subjected to a positive gate bias stress of 30V for 500 seconds under 80° C., c) that has been stored for 7 days under 50 RH % when subjected to a positive gate bias stress of 30V for 1500 seconds under 80° C.

To test the long-term stability of the devices, an acceleration test was performed by taking the $I_dV_g$ curve at 500-second intervals, between which the gate was biased at +30V for 500 seconds at 80° C. (PTBS). As shown in FIG. 9, even after storage under 95 RH % for 7 days, no significant degradation of the transfer characteristics of the passivated devices was observed, showing marked improvement over the comparative devices (c.f. FIG. 3).

Example 5g

Formulation 7 as Passivation Material for IGZO Transistor

Back-channel-etch (BCE) TFTs with exposed IGZO back-surface was fabricated using a standard photolithography process. Specifically, Formulation 7 (containing 87% epoxycyclohexyl ethyl POSS® ("ECPOSS", Hybrid Plastic EP0408, cage content≥50%), 8.7% poly(glycidyl methacrylate) (PGMA, $M_n$=7.5 k, $M_w/M_n$=1.5), 1.8% Irgacure PAG290 (BASF), 1.8% polyphenylmethylsiloxane (PPMS), and 0.7% 2-(3,4-epoxycyclohexyl)-ethyltrimethoxysilane (ECTMS, Gelest, Inc. SIE4670.0) in cyclopentanone) was spin-coated at 1000 rpm onto the back surface of the IGZO semiconductor. The devices were soft-baked at 110° C. for 1 minute on a hot plate under ambient conditions to give a film of about 3.5 µm in thickness as the passivation layer. The passivated TFTs were then flood-cured with UV I-line exposure (300 mJ/cm$^2$), followed by a baking step at 250° C. in a nitrogen flow oven for 30 minutes.

Figure 10:
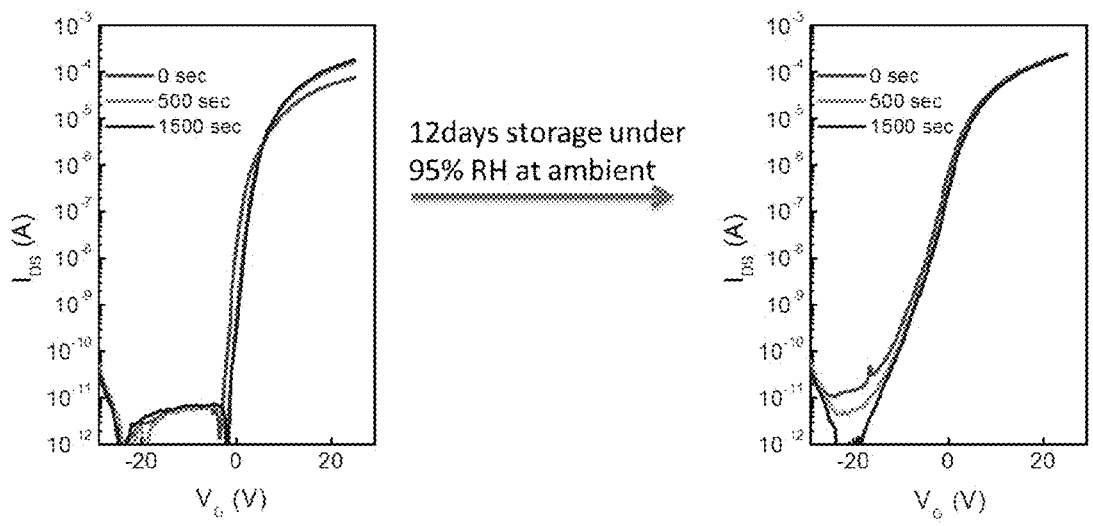
FIG. 10 shows the transfer characteristics of a BCE IGZO TFT having a passivation layer prepared from a formulation according to the present teachings a) when subjected to a positive gate bias stress of 30V for 500 seconds under 80° C., c) that has been stored for 7 days under 50 RH % when subjected to a positive gate bias stress of 30V for 1500 seconds under 80° C.

To test the long-term stability of the devices, an acceleration test was performed by taking the $I_dV_g$ curve at 500-second intervals, between which the gate was biased at +30V for 500 seconds at 80° C. (PTBS). As shown in FIG. 10, even after storage under 95 RH % for 7 days, no significant degradation of the transfer characteristics of the passivated devices was observed, showing marked improvement over the comparative devices (c.f. FIG. 3).

Example 6

Comparative Formulation B as Passivation Material for IGZO Transistor

Back-channel-etch (BCE) TFTs with exposed IGZO back-surface was fabricated using a standard photolithography process. Specifically, comparative formulation B (containing 94% novolac epoxy (Dow Chemical, D.E.N.438), 5% NIT (BASF), 1% polyphenylmethylsiloxane (PPMS) in cyclopentanone) was spin-coated at 1000 rpm onto the back surface of the IGZO semiconductor. The devices were soft-baked at 110° C. for 1 minute on a hot plate under ambient conditions to give a film of about 4.0 µm in thickness as the passivation layer. The passivated TFTs were then flood-cured with UV I-line exposure (4 J/cm$^2$), followed by a 200° C. baking step in a nitrogen flow oven for 120 minutes.

Figure 11:
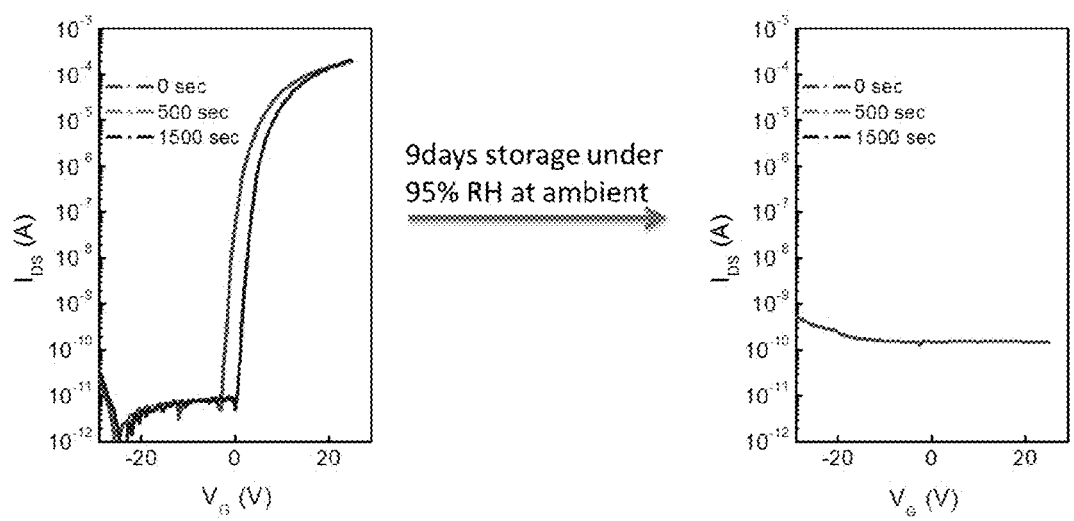
FIG. 11 shows the transfer characteristics of a comparative BCE IGZO TFT having a passivation layer prepared from comparative formulation B a) when subjected to a positive gate bias stress of 30V for 500 seconds under 80° C., c) that has been stored for 7 days under 50 RH % when subjected to a positive gate bias stress of 30V for 1500 seconds under 80° C.

To test the long-term stability of the devices, an acceleration test was performed by taking the $I_dV_g$ curve at 500-second intervals, between which the gate was biased at +30V for 500 seconds at 80° C. (PTBS). Although the passivated devices did not exhibit a significant bias stress effect initially, their transfer characteristics degraded drastically after storage under 95 RH % for 9 days as shown in FIG. 11.

Example 7

Comparative Formulation C as Passivation Material for IGZO Transistor

Back-channel-etch (BCE) TFTs with exposed IGZO back-surface was fabricated using a standard photolithography process. Specifically, comparative formulation C (containing 96% HM1 (see *J. Mater. Chem.*, 2011, 21, 1977-1983), 2% NIT (BASF), 2% polyphenylmethylsiloxane (PPMS) in cyclopentanone) was spin-coated at 1000 rpm onto the back surface of the IGZO semiconductor. The devices were soft-baked at 110° C. for 1 minute on a hot plate under ambient conditions to give a film of about 4.0 µm in thickness as the passivation layer. The passivated TFTs were then flood-cured with UV I-line exposure (4 J/cm$^2$), followed by a baking step at 250° C. in a nitrogen flow oven for 30 minutes.

Figure 12:
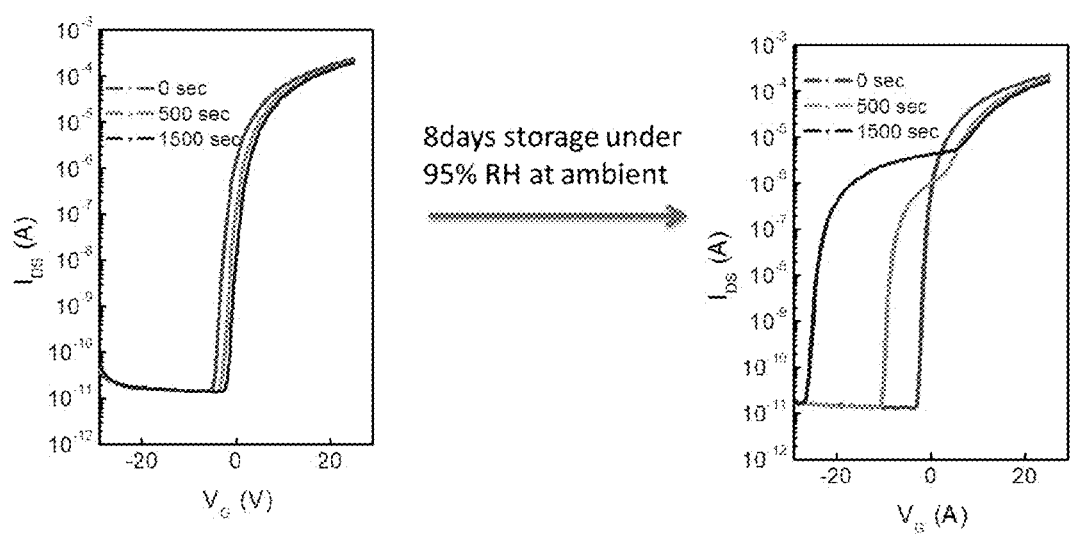
FIG. 12 shows the transfer characteristics of a comparative BCE IGZO TFT having a passivation layer prepared from comparative formulation C a) when subjected to a positive gate bias stress of 30V for 500 seconds under 80° C., c) that has been stored for 7 days under 50 RH % when subjected to a positive gate bias stress of 30V for 1500 seconds under 80° C.

To test the long-term stability of the devices, an acceleration test was performed by taking the $I_dV_g$ curve at 500-second intervals, between which the gate was biased at +30V for 500 seconds at 80° C. (PTBS). Although the passivated devices did not exhibit a significant bias stress effect initially, their transfer characteristics degraded drastically after storage under 95 RH % for 9 days as shown in FIG. 12.

Example 8

Comparative IGZO Transistor without a Passivation Layer

Back-channel-etch (BCE) TFTs with exposed IGZO backsurface was fabricated using a standard photolithography process. No passivation layer was incorporated. The unpassivated TFTs were rinsed with cyclopentanone following by baking step at 250° C. in nitrogen.

Figure 13:
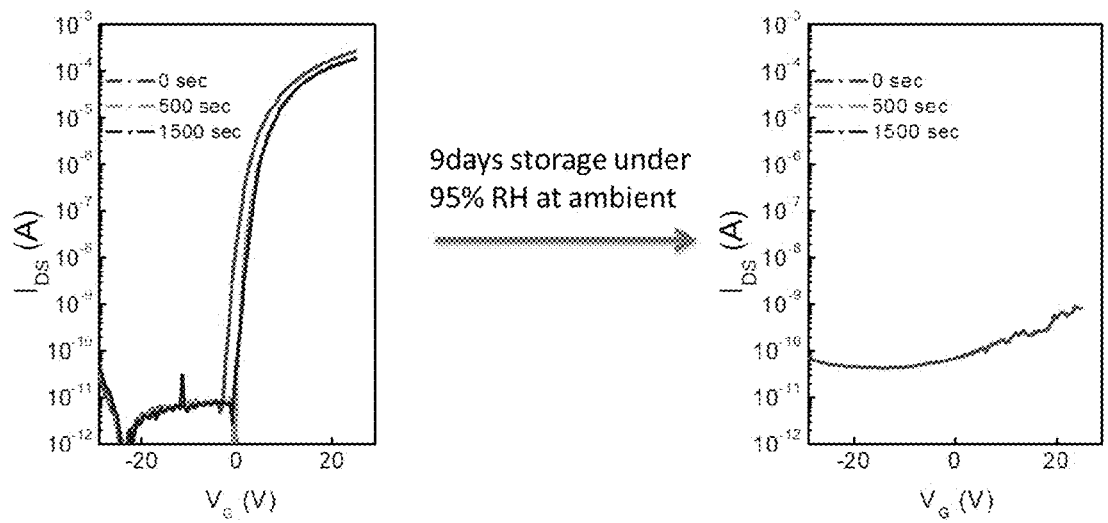
FIG. 13 shows the transfer characteristics of a comparative BCE IGZO TFT without a passivation layer a) when subjected to a positive gate bias stress of 30V for 500 seconds under 80° C., c) that has been stored for 7 days under 50 RH % when subjected to a positive gate bias stress of 30V for 1500 seconds under 80° C.

To test the long-term stability of the devices, an acceleration test was performed by taking the $I_dV_g$ curve at 500-second intervals, between which the gate was biased at +30V for 500 seconds at 80° C. (PTBS). Although the passivated devices did not exhibit a significant bias stress effect initially, their transfer characteristics degraded drastically after storage under 95 RH % for 9 days as shown in FIG. 13.

Example 9

A negative-tone photopatternable material that can be developed by an aqueous solution was prepared and tested as follows. A glycidyl POSS® cage mixture ("GCPOSS", Hybrid Plastic EP0409, 8.5%) was formulated with a thermoplastic polymer (PVP-PMMA, Aldrich 474576, 8.5%), a photoacid generator (NIT, Heraeus, 0.5%), and polyphenylmethylsiloxane (0.3%) in cyclopentanone. The weight percentages given in this example are based on the total weight of the formulation.

Figure 14:
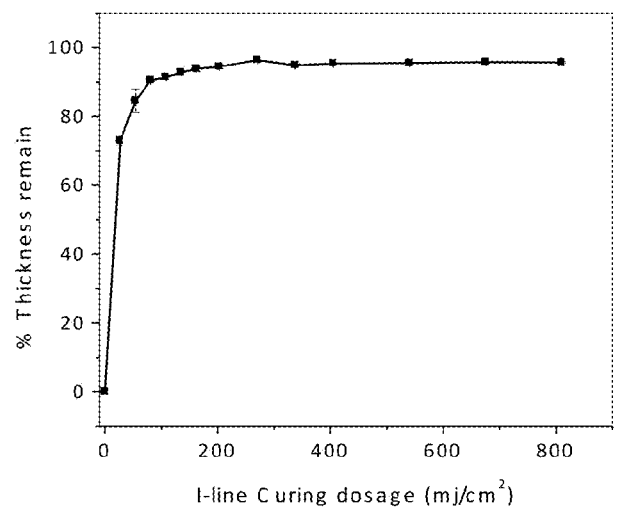
FIG. 14 plots the percentage of film thickness remaining after photocuring and developing against curing dosage. Films were spin-coated from a negative-tone formulation.

The formulation was spin-coated at 1000 rpm onto $SiO_2$ substrates following a 90° C. soft baking step for 1 minute on a hot plate under ambient conditions to give films of about 2 to 3 μm in thickness. The films were then photocrosslinked with UV-I-line (0 mJ/cm² to 800 mJ/cm²), followed by a post-exposure baking step at 90° C. for 1 minute, and developed using an aqueous solution of tetramethylammonium hydroxide (2.38%) as the stripping solvent to remove unexposed (uncrosslinked) portions of the films. The photocrosslinkability of the films are demonstrated as a degree of decreased film thickness loss in FIG. 14. As shown, the materials can be effectively photopatterned in negative tone with UV-I-line with a curing dosage of about 200 mJ/cm² or higher.

Example 10

A positive-tone photopatternable material that can be developed by an aqueous solution was prepared and tested as follows. A glycidyl POSS® cage mixture ("GCPOSS", Hybrid Plastic EP0409, 3%) was formulated with a thermoplastic polymer (PVP-PMMA, Aldrich 474576, 21%), a photosensitizer (DNQ, PAC-TPPA-520, Miwon, 6%), and a fluorinated surfactant (Polyfox-656, 0.5%) in propylene glycol monomethyl ether acetate (PGMEA). The weight percentages given in this example are based on the total weight of the formulation.

Figure 15:
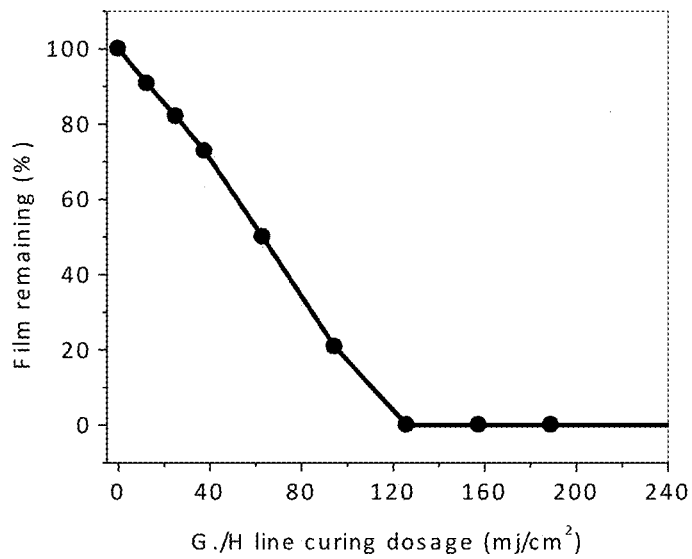
FIG. 15 plots the percentage of film thickness remaining after photocuring and developing against curing dosage. Films were spin-coated from a positive-tone formulation.

The formulation was spin-coated at 1000 rpm onto $SiO_2$ substrates following a 90° C. soft baking step for 1 minute on a hot plate under ambient conditions to give films of about 2 to 3 μm in thickness. The films were then photocrosslinked with UV-G/H-line (0 mJ/cm² to 300 mJ/cm²), and developed using an aqueous solution of tetramethylammonium hydroxide (2.38%) as the stripping solvent to remove exposed portions of the films which have been made soluble. The photocrosslinkability of the films are demonstrated as a degree of film thickness loss in FIG. 15. As shown, the materials can be effectively photopatterned in positive tone with UV-G/H-line with a curing dosage of about 120 mJ/cm² or higher.

Example 11

A photopatternable composition consisting of a polyhedral oligomeric silsesquioxane cage mixture and a photocrosslinkable polymer (without any photosensitizers, photoacid generators, or photoinitiators) was investigated as passivation materials for organic semiconductor devices.

More specifically, a new dienoic cinnamate-functionalized polyhedral oligomeric silsesquioxane derivative was synthesized as follows.

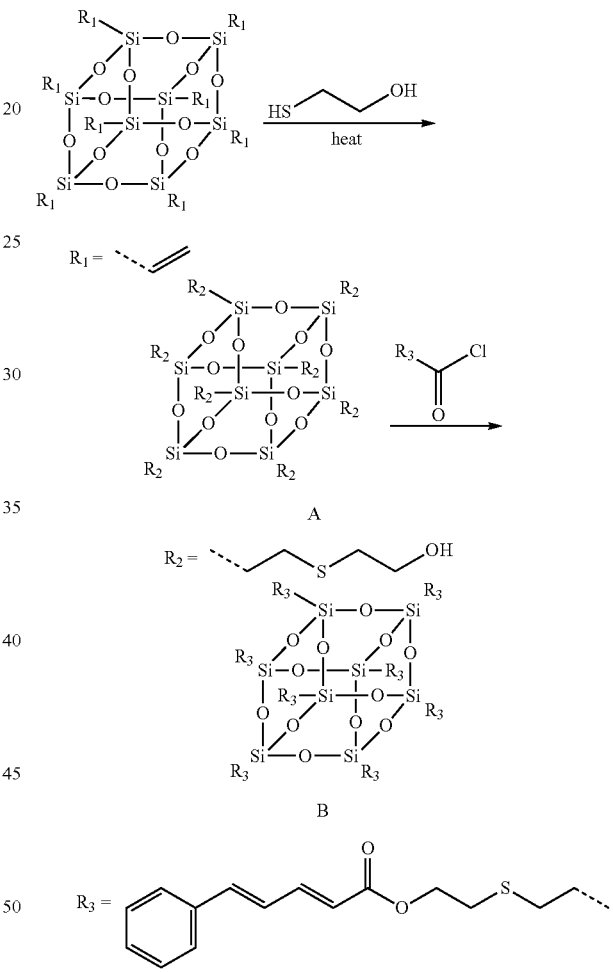

Synthesis of Octahydroxy POSS (Compound A)

Octavinyl POSS (10 g), 2-mercaptoethanol (7.9 g), and dry THF (80 mL) were added into a 250-mL flask. The flask was purged with $N_2$ for 30 minutes and kept stirring at room temperature until all chemicals were dissolved completely. Subsequently, an azo initiator, V-65 (Wako Specialty Chemicals, 50 mg), dissolved in 2 mL of dry THF, was injected into the reactor. The reaction was kept at 70° C. overnight under a $N_2$ atmosphere. Afterwards, the solvent was removed using a rotary evaporator. The flask was kept at 65° C. under vacuum for 3 hours to remove THF completely. ¹H NMR (CD₃OD, ppm): 0.90-1.15 (—Si—$CH_2$—, 16H), 2.55-2.75 (—$CH_2$—S—$CH_2$—, 32H), 3.55-3.75 (—$CH_2$—O—, 16H).

Synthesis of Dienoic Cinnamate-Functionalized POSS (Compound B)

Octahydroxy POSS (Compound A, 6 g) and dry THF (40 mL) were added into a 150-mL round bottom flask and kept stirring at room temperature for 1 h under a $N_2$ atmosphere. Then, 4.5 g of triethylamine was injected into the flask and the flask was purged with $N_2$ for another 15 minutes.

$R_3C(O)Cl$ (7.5 g) was dissolved into 40 mL of dry THF. Then, the THF solution was added into the octahydroxy POSS solution kept in an ice water bath. The reaction solution was kept stirring at room temperature overnight in the dark. The following morning, THF was removed using a rotary evaporator. DCM (100 ml) was added into the reactor and kept stirring for 1 hour. Subsequently, the DCM solution was washed with a 5% aqueous solution of $Na_2CO_3$ three times followed by deionized water until the pH reached 7. $MgSO_4$ was added into the DCM solution and kept stirring for 1 hour until the solution became clear. Then the DCM solution was filtered to remove $MgSO_4$ salt. Silicone gel was added and the solution was kept stirring at room temperature for another 2 hours. The solution was filtered and DCM was removed using a rotary evaporator. The final product was dried under vacuum overnight. $^1H$ NMR ($CDCl_3$): 096-1.14 (—Si—$CH_2$—, 16H), 2.55-2.75 (—$CH_2$—S—$CH_2$—, 32H), 4.26-4.34 (—$CH_2$—O—, 16H), 5.87-5.99 (=CH—COO—, 8H), 6.72-6.90 (=CH—CH=, 16H), 7.19-7.48 (Ph-CH=, 20H).

A formulation containing 27 wt. % of compound B and 9 wt. % of a dienoic cinnamate-functionalized acetate polymer (see U.S. Patent Application Publication No. 2013/0200345) was prepared in PGMEA. The formulation was spin-coated at 700 rpm onto polyimide substrates (DuPont Kapton® 100NT), followed by a soft baking step at 110° C. for 1 minute on a hot plate under ambient conditions to provide thin films with a thickness of about 4.2 µm. The films were then photocrosslinked with flood UV for 40 seconds. The photocrosslinked films demonstrated a water vapor transmission rate (WVTR) of ~400 g/m²/day using a MOCON® barrier at 37.8° C.

The test was repeated using thicker films (~17 µm) obtained by performing three cycles of the spin-coating/soft baking/flood UV crosslinking steps described above. The resulting films demonstrated a water vapor transmission rate (WVTR) of ~100 g/m²/day.

Having demonstrated that the formulation can provide films with good moisture-barrier properties, organic thin film transistor (OTFT) test devices were fabricated with the photocrosslinked films as the passivation layer. More specifically, the same formulation was spin-coated at 700 rpm for 60 seconds over a finished bottom-contact, top-gate OTFT. The OTFT test devices incorporate a cyano-substituted perylene diimide n-type semiconductor active channel with a polymeric dielectric layer on a flexible substrate. The passivation film was soft baked at ~110° C. for 1 minute on a hot plate under ambient conditions followed by 40 s of UV flood curing. The photocrosslinked films were then developed using PGMEA to give a film thickness of about 4.2 µm on the entire device except the electrodes. In some of the test devices, the entire process (spin coating, soft baking, UV curing and developing) was repeated three more times to give 4 layers of the passivation material (total thickness about 17 µm).

Figure 16:
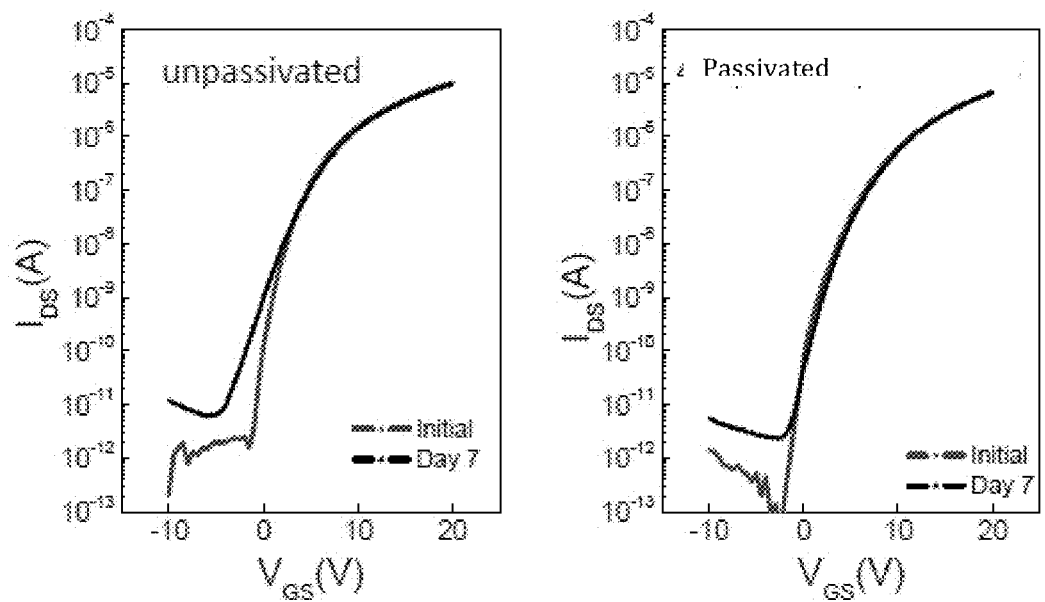
FIG. 16 compares the $I_D$-$V_G$ curves of passivated devices and control unpassivated devices after 7 days of storage in high humidity conditions.

The $I_DV_G$ curves ($V_G$: -6V to 6V, $V_D$=6V) were measured for the TFT test devices before and after application of the passivation material. No difference was observed for either the 1-layer devices or the 4-layer devices. However, passivated devices showed much better long-term stability compared to control unpassivated devices. Specifically, after 7 days of being stored in a 95% RH storage chamber, unpassivated devices showed both an earlier $V_{ON}$ and worse subthreshold swing. For the passivated devices, no change in the $I_DV_G$ curve was observed (FIG. 16).

The present teachings can be embodied in other specific forms without departing from the spirit or essential characteristics thereof. The foregoing embodiments are therefore to be considered in all respects illustrative rather than limiting on the present teachings described herein. The scope of the present teachings is thus indicated by the appended claims rather than by the foregoing description, and all changes that come within the meaning and range of equivalency of the claims are intended to be embraced therein.

The invention claimed is:

1. A solution-processable composition for preparing a photopatternable material, the composition comprising:
   (a) an oligomeric siloxane component, wherein the oligomeric siloxane component comprises, based on its total weight, between about 40% by weight and about 100% by weight one or more cage-structured polyhedral oligomeric silsesquioxanes of the formula:

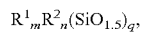

wherein:
   each $R^1$ comprises a cycloaliphatic epoxy moiety;
   each $R^2$ independently is selected from the group consisting of H, F, a $C_{1-20}$ alkyl group, a $C_{1-20}$ fluoroalkyl group, a $C_{3-20}$ cycloalkyl group, a $C_{6-20}$ aryl group, and a $C_{7-20}$ arylakyl group;
   q is 8, 10 or 12; and
   m and n are integers, provided that m+n=q and m is at least 1;
   (b) a polymerization initiator;
   (c) one or more thermosettable polymers selected from the group consisting of polyisoprene, isobutylene isoprene rubber, polybutadiene, styrene-butadiene rubber, acrylonitrile butadiene rubber, hydrogenated nitrile rubbers, ethylene propylene copolymer, ethylene propylene diene rubber, polyacrylic rubber, fluorosilicone rubber, and ethylene-vinyl acetate, wherein the one or more thermosettable polymers collectively are present in an amount between about 1% by weight and about 20% by weight based on the total weight of the oligomeric siloxane component; and
   (d) a solvent;
   wherein the oligomeric siloxane component is present in an amount between about 40% and about 98% based on 100% by weight solids of the composition.

2. The composition of claim 1, wherein said oligomeric siloxane component comprises, based on its total weight, less than about 40% by weight non-cage structured oligomeric siloxanes, and wherein said non-cage structured oligomeric siloxanes comprise one or more cycloaliphatic epoxy moieties.

3. The composition of claim 2, wherein said non-cage structured oligomeric siloxanes comprise random-structured oligomeric siloxanes, ladder-structured oligomeric siloxanes, partially cage-structured oligomeric siloxanes, or combinations thereof.

4. The composition of claim 1, wherein q is 8.

5. The composition of claim 1, wherein the polymerization initiator is a photoinitiator.

6. The composition of claim 5, wherein the photoinitiator is a free radical photoinitiator or a cationic photoinitiator.

7. The composition of claim 1, wherein the thermosettable polymers collectively are present in an amount between about 1% and about 40% based on 100% by weight solids of the composition.

8. The composition of claim 1, wherein the polymerization initiator is present in an amount between about 1% and about 8% based on 100% by weight solids of the composition.

9. The composition of claim 1, wherein the solvent is present in an amount between about 20% by weight and about 80% by weight based on the total weight of the composition.

10. The composition of claim 1 further comprising one or more additives selected from the group consisting of a leveling agent, an adhesion promoter, a wetting agent, and a rheology modifier, wherein each of the one or more additives is present in an amount between about 1% and about 10% based on 100% by weight solids of the composition.

11. The composition of claim 1, wherein the composition comprises a photocurable monomer or oligomer.

12. A solution-processable composition for preparing a photopatternable material, the composition comprising:
(a) an oligomeric siloxane component, wherein the oligomeric siloxane component comprises, based on its total weight, between about 40% by weight and about 100% by weight one or more cage-structured polyhedral oligomeric silsesquioxanes of the formula:

$R^1_m R^2_n (SiO_{1.5})_q$, wherein:
each $R^1$ comprises a cycloaliphatic epoxy moiety;
each $R^2$ independently is selected from the group consisting of H, F, a $C_{1-20}$ alkyl group, a $C_{1-20}$ fluoroalkyl group, a $C_{3-20}$ cycloalkyl group, a $C_{6-20}$ aryl group, and a $C_{7-20}$ arylakyl group;
q is 8, 10 or 12; and
m and n are integers, provided that m+n=q and m is at least 1;
(b) a polymerization initiator;
(c) one or more thermosettable polymers selected from the group consisting of polyisoprene, isobutylene isoprene rubber, polybutadiene, styrene-butadiene rubber, acrylonitrile butadiene rubber, hydrogenated nitrile rubbers, ethylene propylene copolymer, ethylene propylene diene rubber, polyacrylic rubber, fluorosilicone rubber, and ethylene-vinyl acetate, wherein the one or more thermosettable polymers collectively are present in an amount between about 1% by weight and about 20% by weight based on the total weight of the oligomeric siloxane component, and wherein each of the thermosettable polymers comprises in its backbone, as pendant groups, and/or as terminal groups one or more functional groups independently selected from the group consisting of a carboxylic acid group, an anhydride group, an amine group, a glycidyl ether group, a cycloaliphatic epoxy group, an acrylate group, and a methacrylate group; and
(d) a solvent.

13. The composition of claim 12, wherein said oligomeric siloxane component comprises, based on its total weight, less than about 40% by weight non-cage structured oligomeric siloxanes, and wherein said non-cage structured oligomeric siloxanes comprise one or more cycloaliphatic epoxy moieties.

14. The composition of claim 13, wherein said non-cage structured oligomeric siloxanes comprise random-structured oligomeric siloxanes, ladder-structured oligomeric siloxanes, partially cage-structured oligomeric siloxanes, or combinations thereof.

15. The composition of claim 12, wherein q is 8.

16. The composition of claim 12, wherein at least one of the following is true: (i) the thermosettable polymers collectively are present in an amount between about 1% and about 40% based on 100% by weight solids of the composition; (ii) the polymerization initiator is present in an amount between about 1% and about 8% based on 100% by weight solids of the composition; (iii) the solvent is present in an amount between about 20% by weight and about 80% by weight based on the total weight of the composition; and/or (iv) the oligomeric siloxane component is present in an amount between about 40% and about 98% based on 100% by weight solids of the composition.

17. The composition of claim 12 further comprising one or more additives selected from the group consisting of a leveling agent, an adhesion promoter, a wetting agent, and a rheology modifier, wherein each of the one or more additives is present in an amount between about 1% and about 10% based on 100% by weight solids of the composition.

18. The composition of claim 17, wherein the leveling agent is a polysiloxane leveling agent and wherein the adhesion promoter is a trialkoxysilane adhesion promoter.

19. The composition of claim 12, wherein the composition comprises a photocurable monomer or oligomer.

20. A solution-processable composition for preparing a photopatternable material, the composition comprising:
(a) an oligomeric siloxane component, wherein the oligomeric siloxane component comprises, based on its total weight, between about 40% by weight and about 100% by weight one or more cage-structured polyhedral oligomeric silsesquioxanes of the formula:

$R^1_m R^2_n (SiO_{1.5})_q$, wherein:
each $R^1$ comprises a cycloaliphatic epoxy moiety;
each $R^2$ independently is selected from the group consisting of H, F, a $C_{1-20}$ alkyl group, a $C_{1-20}$ fluoroalkyl group, a $C_{3-20}$ cycloalkyl group, a $C_{6-20}$ aryl group, and a $C_{7-20}$ arylakyl group;
q is 8, 10 or 12; and
m and n are integers, provided that m+n=q and m is at least 1;
(b) a polymerization initiator;
(c) one or more thermosettable polymers selected from the group consisting of polyisoprene, isobutylene isoprene rubber, polybutadiene, styrene-butadiene rubber, acrylonitrile butadiene rubber, hydrogenated nitrile rubbers, ethylene propylene copolymer, ethylene propylene diene rubber, polyacrylic rubber, fluorosilicone rubber, and ethylene-vinyl acetate, wherein the one or more thermosettable polymers collectively are present in an amount between about 1% by weight and about 20% by weight based on the total weight of the oligomeric siloxane component;
(d) a solvent; and at least one of:
(e) a polysiloxane leveling agent present in an amount between about 1% and about 10% by weight based on 100% weight solids of the composition; or
(f) a trialkoxysilane adhesion promoter selected from the group consisting of -continued
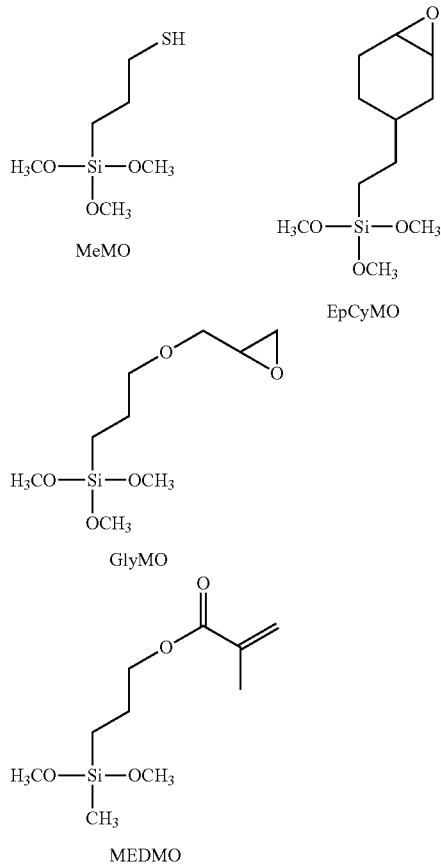
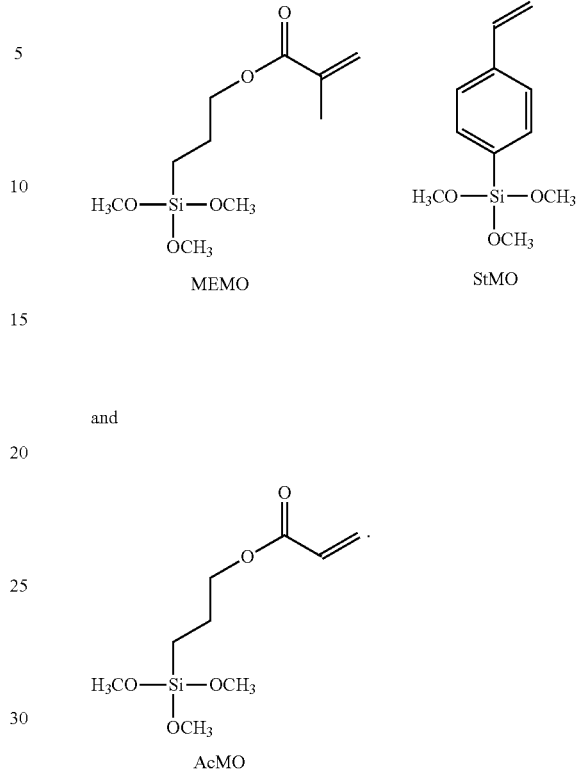
* * * * *